(12) United States Patent
Simmons et al.

(10) Patent No.: US 9,506,973 B2
(45) Date of Patent: Nov. 29, 2016

(54) HIGH VOLTAGE CHUCK FOR A PROBE STATION

(75) Inventors: Michael E. Simmons, Colton, OR (US); Kazuki Negishi, Beaverton, OR (US); Roy Jensen, Lapine, OR (US); Ryan Garrison, Beaverton, OR (US); Philip Wolf, Aloha, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 599 days.

(21) Appl. No.: 13/702,054

(22) PCT Filed: Apr. 11, 2011

(86) PCT No.: PCT/US2011/031981
§ 371 (c)(1),
(2), (4) Date: Dec. 4, 2012

(87) PCT Pub. No.: WO2011/156049
PCT Pub. Date: Dec. 15, 2011

(65) Prior Publication Data
US 2013/0075982 A1    Mar. 28, 2013

Related U.S. Application Data

(60) Provisional application No. 61/352,061, filed on Jun. 7, 2010, provisional application No. 61/377,423, filed on Aug. 26, 2010.

(51) Int. Cl.
*G01R 31/26* (2014.01)
*H01L 21/683* (2006.01)
*G01R 31/28* (2006.01)

(52) U.S. Cl.
CPC ....... *G01R 31/2601* (2013.01); *G01R 31/2865* (2013.01); *G01R 31/2874* (2013.01); *H01L 21/6838* (2013.01); *Y10T 279/11* (2015.01); *Y10T 279/34* (2015.01)

(58) Field of Classification Search
CPC .......... G01R 31/2865; H01L 21/6838; Y10T 279/11
USPC .............................................. 279/3
See application file for complete search history.

(56) References Cited

U.S. PATENT DOCUMENTS 5,303,938 A * 4/1994 Miller et al. ............... 279/3
5,981,913 A    11/1999 Kadomura et al.
6,104,203 A    8/2000 Costello et al.
(Continued)

FOREIGN PATENT DOCUMENTS

JP    H09-172056    6/1997

OTHER PUBLICATIONS

English-language abstract of Japanese Patent Publication No. H09-172056, 1997.

*Primary Examiner* — Eric A Gates
(74) *Attorney, Agent, or Firm* — Dascenzo Intellectual Property Law, P.C.

(57) ABSTRACT

A chuck for testing an integrated circuit includes an upper conductive layer having a lower surface and an upper surface suitable to support a device under test. An upper insulating layer has an upper surface at least in partial face-to-face contact with the lower surface of the upper conductive layer, and a lower surface. A middle conductive layer has an upper surface at least in partial face-to-face contact with the lower surface of the upper insulating layer, and a lower surface.

12 Claims, 22 Drawing Sheets

(56) References Cited

U.S. PATENT DOCUMENTS

| | | |
|---|---|---|
| 6,132,551 A | 10/2000 | Horioka et al. |
| 6,256,187 B1 | 7/2001 | Matsunaga et al. |
| 6,259,592 B1 | 7/2001 | Ono |
| 6,424,141 B1 * | 7/2002 | Hollman et al. ......... 324/750.19 |
| 6,540,014 B2 * | 4/2003 | Getchel et al. ............. 165/80.1 |
| 6,583,638 B2 | 6/2003 | Costello et al. |
| 6,700,397 B2 * | 3/2004 | Hollman et al. ......... 324/756.01 |
| 6,744,268 B2 * | 6/2004 | Hollman .................. 324/750.14 |
| 6,914,423 B2 | 7/2005 | Nordgren et al. |
| 6,965,226 B2 | 11/2005 | Dunklee |
| 7,091,733 B2 * | 8/2006 | Takekoshi et al. ...... 324/750.03 |
| 7,187,188 B2 | 3/2007 | Andrews et al. |
| 7,268,533 B2 | 9/2007 | Harris et al. |
| 7,357,842 B2 * | 4/2008 | Ishikawa et al. ............. 118/503 |
| 7,492,172 B2 | 2/2009 | Stewart et al. |
| 7,619,870 B2 | 11/2009 | Himori et al. |
| 8,240,650 B2 | 8/2012 | Teich et al. |
| 2002/0066551 A1 | 6/2002 | Stone et al. |
| 2002/0163350 A1 | 11/2002 | Kiesewetter et al. |
| 2003/0155939 A1 | 8/2003 | Lutz et al. |
| 2004/0045509 A1 | 3/2004 | Or et al. |
| 2007/0023320 A1 * | 2/2007 | Itakura et al. ................. 206/710 |
| 2007/0024313 A1 * | 2/2007 | Itakura et al. ................. 324/765 |
| 2008/0042374 A1 | 2/2008 | Dunklee |
| 2008/0042376 A1 | 2/2008 | Nordgren et al. |
| 2008/0042642 A1 | 2/2008 | Dunklee |
| 2008/0042669 A1 | 2/2008 | Nordgren et al. |
| 2008/0054884 A1 | 3/2008 | Dunklee |
| 2008/0224426 A1 | 9/2008 | Teich et al. |
| 2009/0050621 A1 * | 2/2009 | Awazu et al. ................ 219/444.1 |
| 2010/0110603 A1 | 5/2010 | LaFontaine et al. |

* cited by examiner

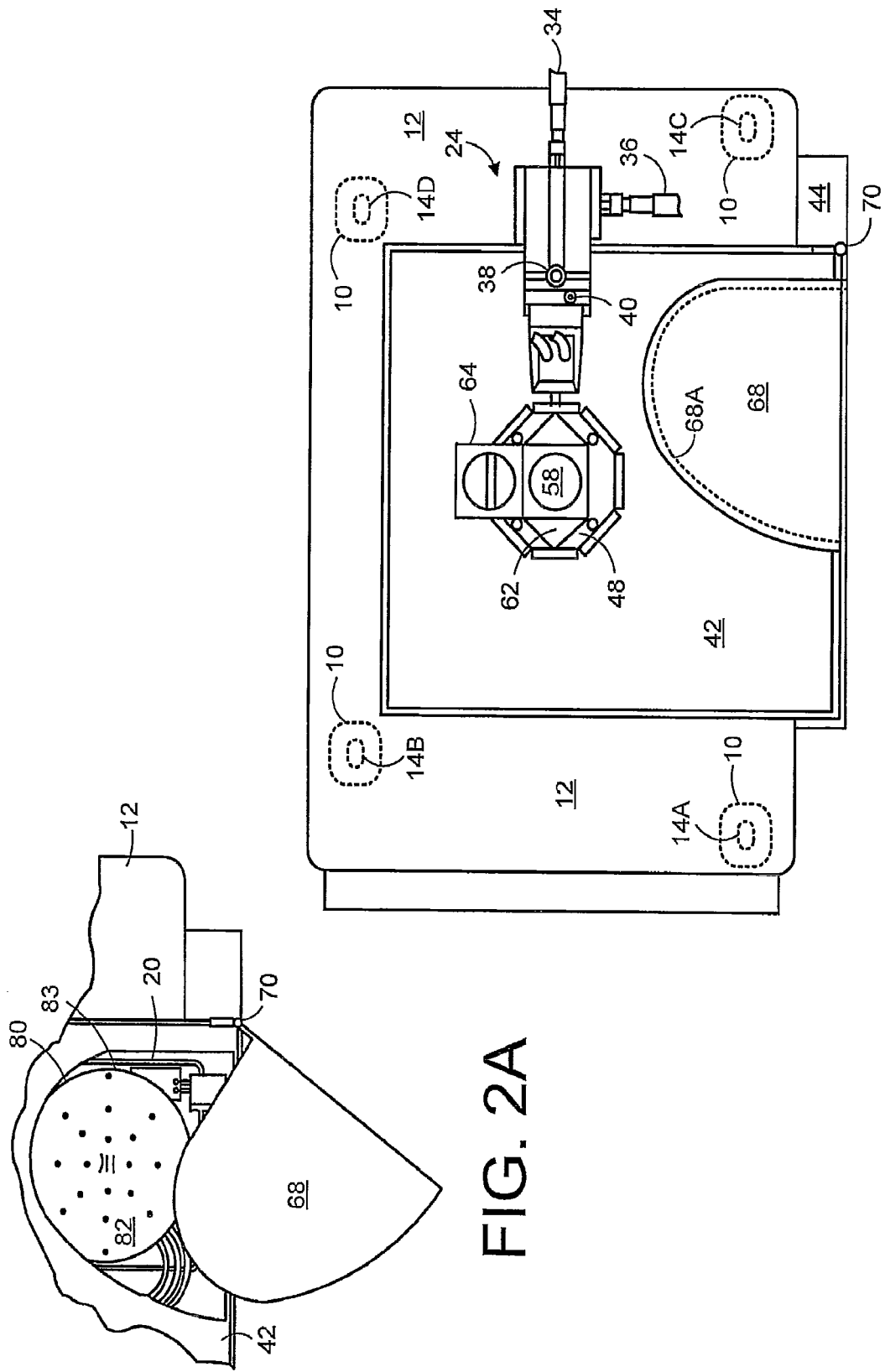

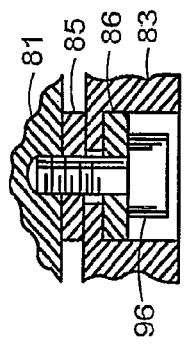
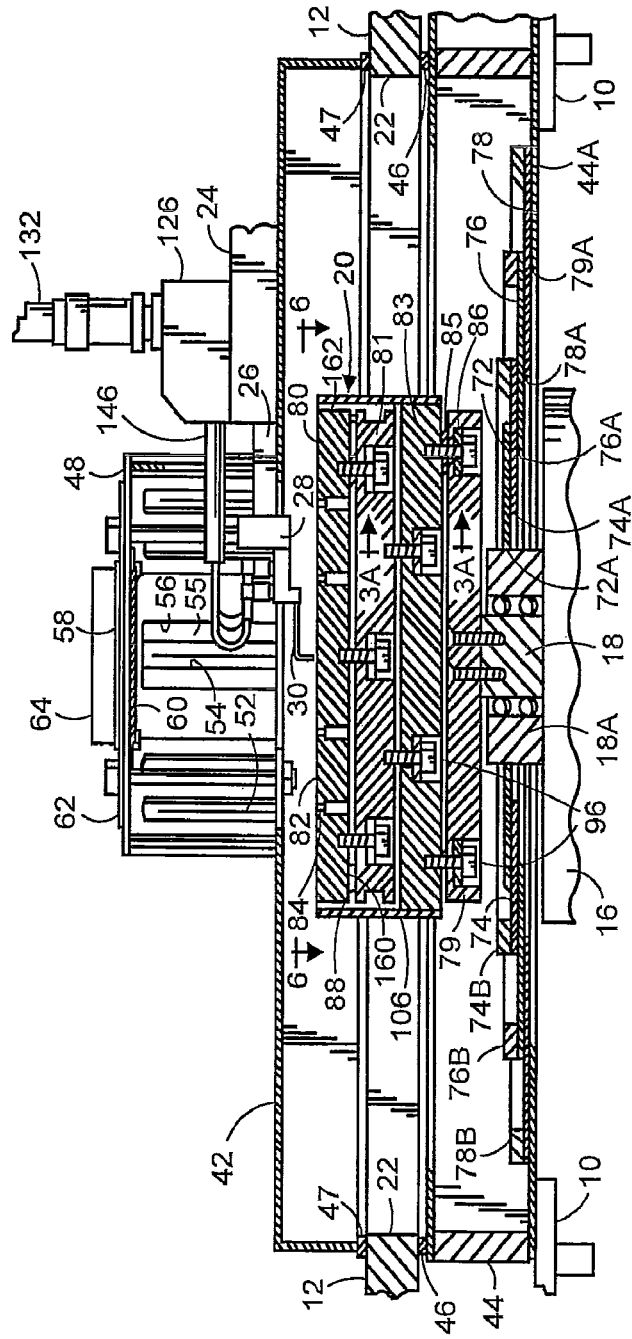
FIG. 3A
FIG. 3B

HIGH VOLTAGE CHUCK FOR A PROBE STATION

CROSS-REFERENCE TO RELATED APPLICATIONS

This application claims the benefit of U.S. provisional application Ser. No. 61/352,061 filed on Jun. 7, 2010, and U.S. provisional application Ser. No. 61/377,423 filed on Aug. 26, 2010, both of which are incorporated herein by reference in their entireties.

BACKGROUND OF THE INVENTION

The present invention relates to a chuck suitable for high voltage testing for a semiconductor wafer, and, more particularly, to wafer chuck designs having improved performance over a range of operating temperatures and testing conditions.

Processing semiconductor wafers include processes that form a large number of devices within and on the surface of the semiconductor wafer (hereinafter referred to simply as "wafer"). After fabrication, these devices are typically subjected to various electrical tests and characterizations. In some cases, the electrical tests characterize the operation of circuitry and in other cases characterize the semiconductor process. By characterizing the circuitry and devices thereon, the yield of the semiconductor process may be increased.

Wafer chucks used for high voltage testing may be required to operate across a wide range of temperature while exhibiting sufficient performance characteristics such as, for example, thermal uniformity across the surface of the chuck in contact with the wafer or device under test (DUT), suitable thermal transition time for the particular tests performed, adequate flatness of the chuck surface over the range of temperatures used, and low AC and DC electrical noise. Typically, wafer chucks are designed to hold the wafer or device under test using a vacuum, and such chucks require substantial supporting structure and associated equipment for accurately positioning the device under test in a controlled manner and for doing so within a controlled environment.

Changes in chuck design to accomplish a particular requirement may have adverse effects on costs, quality and/or testing processing times. For example, adding material to the chuck may increase costs for the particular material added, require additional thermal controls (such as additional chiller equipment for the probe station), add testing processing time due to an increase in thermal mass and decrease thermal transition time, contribute non-uniformities in thermal characteristics to the devices under test (thus decreasing testing quality and accuracy), and add to the overall physical space requirements within the probe station (causing other components to require resizing or increased sizes).

What is needed, therefore, are improved chuck designs that address these and other challenges. The foregoing and other objectives, features and advantages of the invention will be more readily understood upon consideration of the following detailed description of the invention taken in conjunction with the accompanying drawings.

BRIEF DESCRIPTION OF THE SEVERAL VIEWS OF THE DRAWINGS

For a more complete understanding of the present invention, the drawings herein illustrate examples of the invention. The drawings, however, do not limit the scope of the invention. Similar references in the drawings indicate similar elements.

FIG. 2A is a partial top view of the wafer probe station of FIG. 1 with the enclosure door shown partially open.

FIG. 2B is a top view of the wafer probe station of FIG. 1.

FIG. 3A is an enlarged sectional view taken along line 3A-3A of FIG. 3B.

FIG. 3B is a partially sectional and partially schematic front view of the probe station of FIG. 1.

FIG. 20b is a transparent view of the connection shown in FIG. 20a.

FIG. 20c is a side view of the connection shown in FIG. 20a.

FIG. 20d is a sectional view of the connection shown in FIG. 20a.

FIG. 20e is a cut view of the connection shown in FIG. 20a.

DETAILED DESCRIPTION OF PREFERRED EMBODIMENT

In the following detailed description, numerous specific details are set forth in order to provide a thorough understanding of the preferred embodiments. However, those skilled in the art will understand that the present invention may be practiced without these specific details, that the present invention is not limited to the depicted embodiments, and that the present invention may be practiced in a variety of alternate embodiments. In other instances, well-known methods, procedures, components and systems have not been described in detail.

Figure 1:
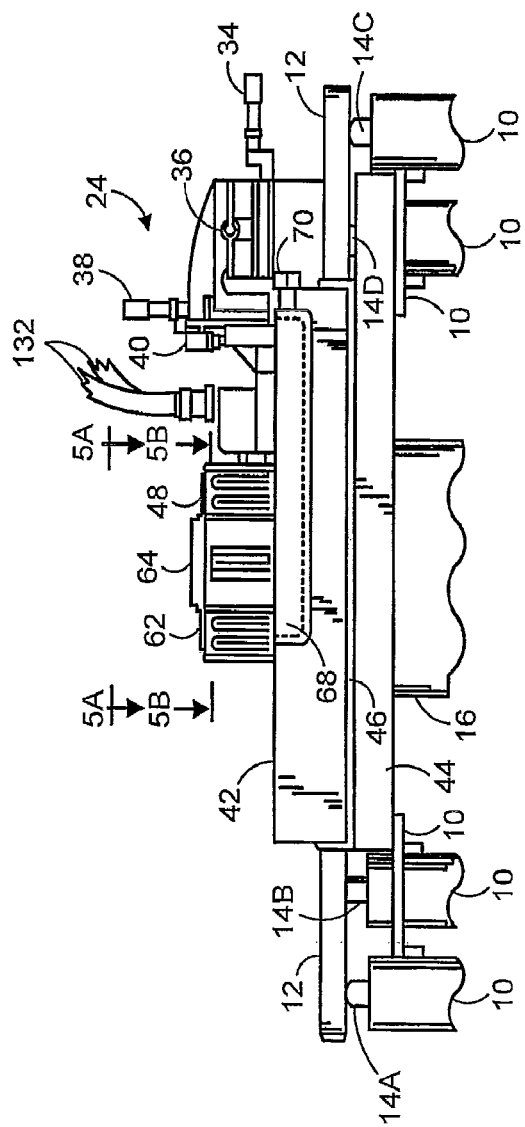
FIG. 1 is a partial front view of an exemplary embodiment of a wafer probe station constructed in accordance with the present invention.

In many cases a probe station, such as those available from Cascade Microtech, Inc., are used to perform the characterization of the semiconductor process. With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e., horizontally along two mutually perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes, respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure (fully sealed, partially sealed, or otherwise) is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

Figure 5A:
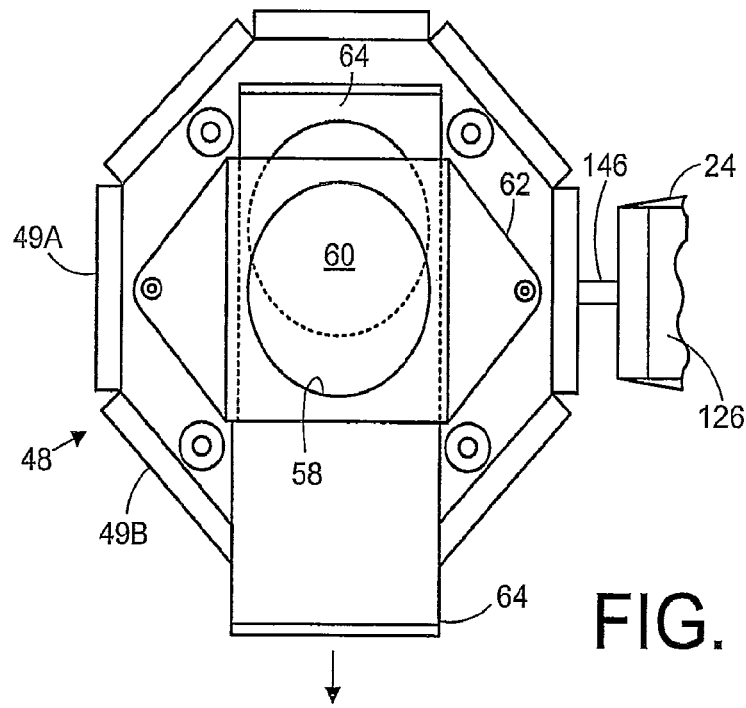
FIG. 5A is an enlarged top detail view taken along line 5A-5A of FIG. 1.
Figure 5B:
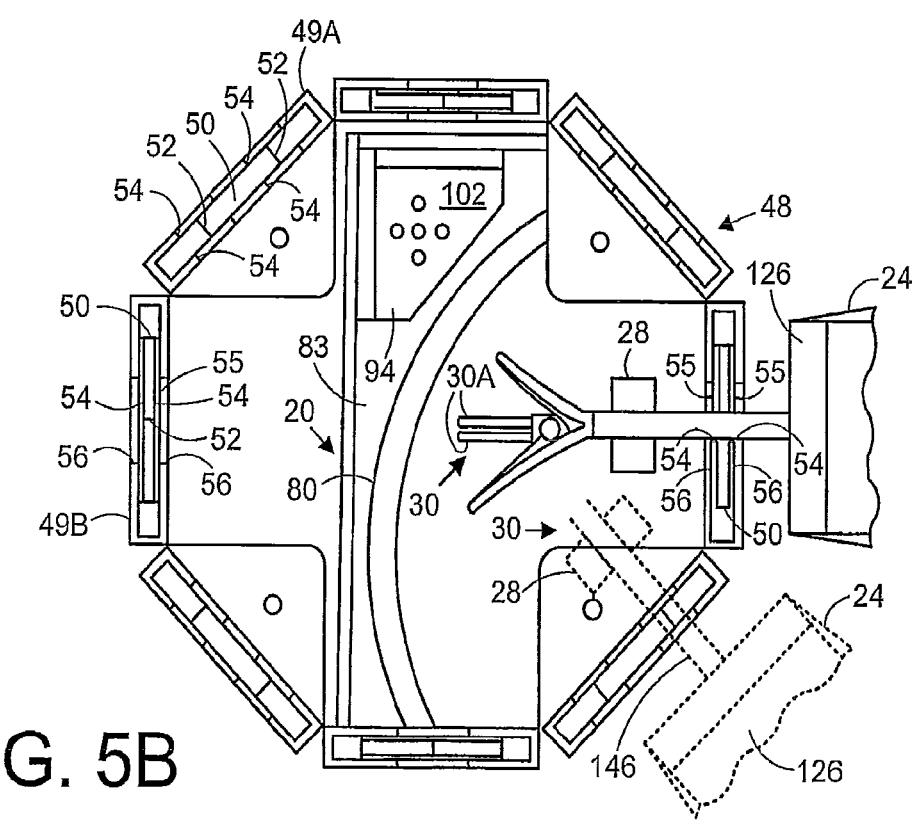
FIG. 5B is an enlarged top sectional view taken along line 5B-5B of FIG. 1.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

Figure 4:
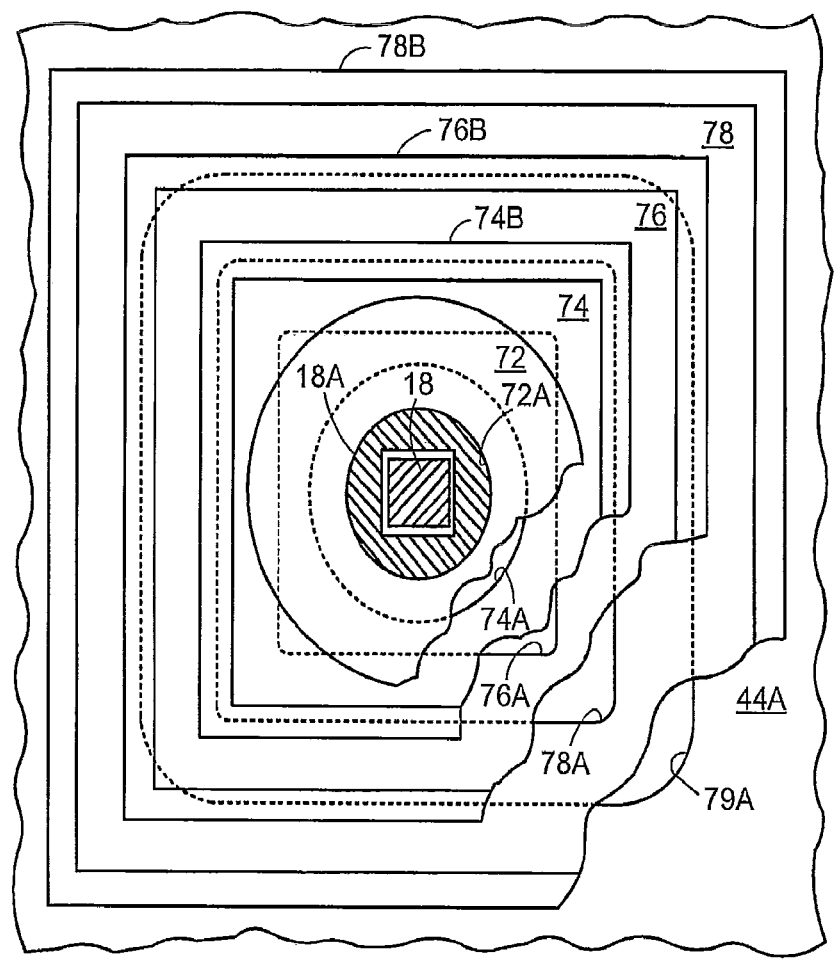
FIG. 4 is a top view of the sealing assembly where the motorized positioning mechanism extends through the bottom of the enclosure.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically movable plunger 18. The next plate in the downward progression, plate 74, has an upwardly projecting peripheral margin 74b which limits the extent to which the plate 72 can slide across the top of the plate 74. The central aperture 74a in the plate 74 is of a size to permit the positioner 16 to move the plunger 18 and its bearing housing 18 a transversely along the X and Y axes until the edge of the top plate 72 abuts against the margin 74*b* of the plate 74. The size of the aperture 74*a* is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74*b* results in the sliding of the plate 74 toward the peripheral margin 76*b* of the next underlying plate 76. Again, the central aperture 76*a* in the plate 76 is large enough to permit abutment of the plate 74 with the margin 76*b*, but small enough to prevent the plate 74 from uncovering the aperture 76*a*, thereby likewise maintaining the seal between the plates 74 and 76. Still further movement of the plunger 18 and bearing housing in the same direction causes similar sliding of the plates 76 and 78 relative to their underlying plates into abutment with the margin 78*b* and the side of the box portion 44, respectively, without the apertures 78*a* and 79*a* becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

Figure 6:
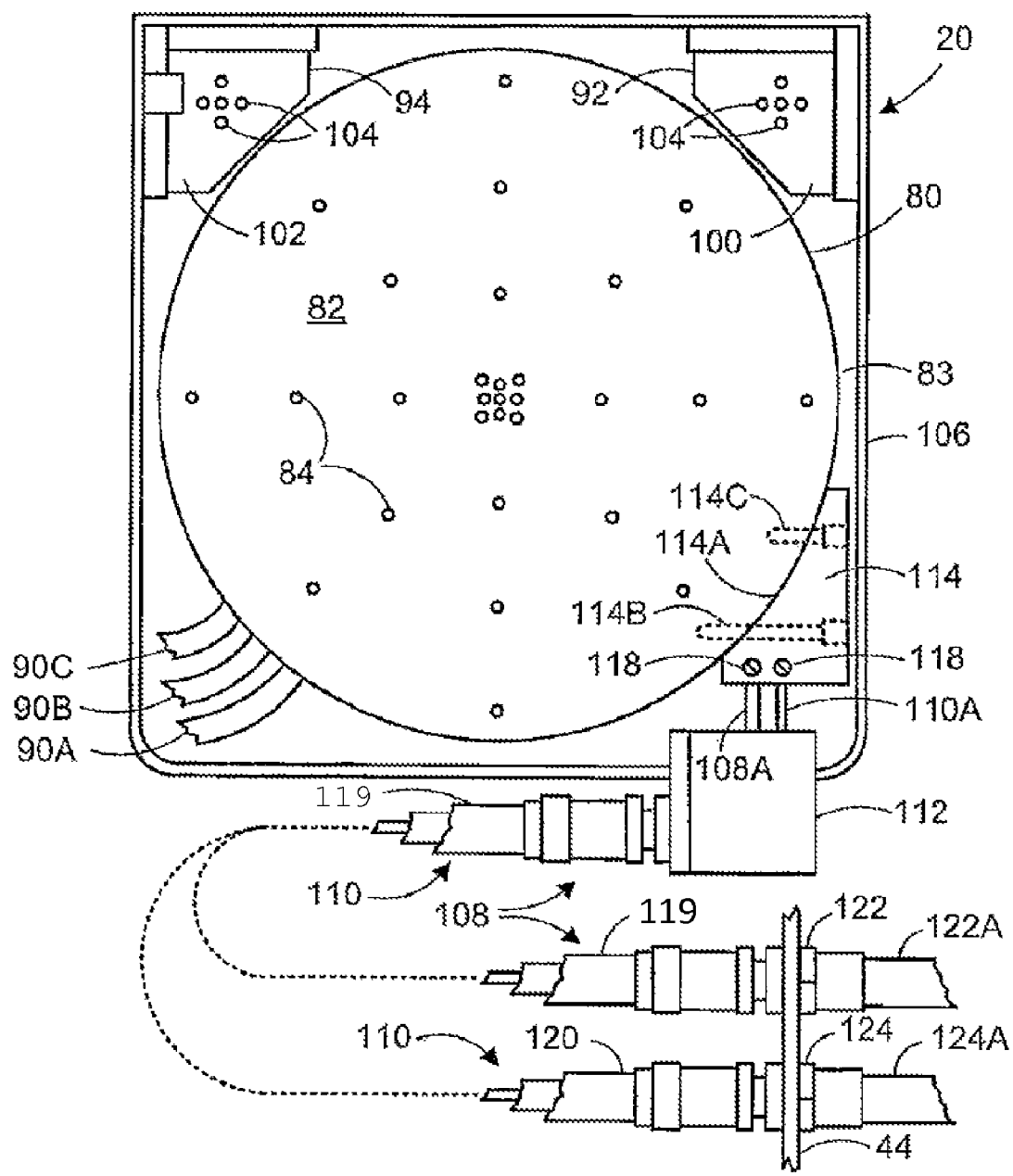
FIG. 6 is a partially schematic top detail view of the chuck assembly, taken along line 6-6 of FIG. 3.
Figure 7:
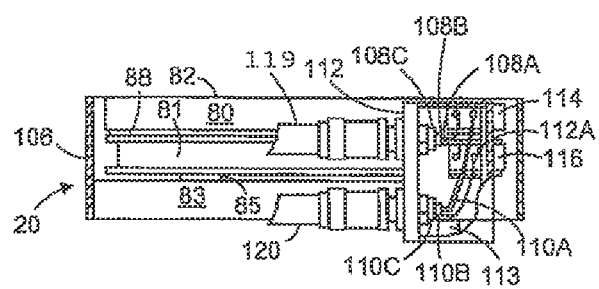
FIG. 7 is a partially sectional front view of the chuck assembly of FIG. 6.

With particular reference to FIGS. 3, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly facing wafer supporting surface 82 having an array of vertical apertures 84 therein. These apertures communicate with respective chambers separated by O-rings 88, the chambers in turn being connected separately to different vacuum lines 90*a*, 90*b*, 90*c* (FIG. 6) communicating through separately controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

The apertures 84 of the element 80 may be positioned as shown in FIG. 6 for the surface 82, for conducting sufficiently strong vacuum to hold a wafer (not shown). More preferably, a greater number of holes (apertures) 84 are used, positioned on the surface 82 for improved holding of a wafer. The bottom surface of the element 80 may have machined channels or grooves typically, in various designs, of widths varying from 300 to 3000 microns to conduct the vacuum. For example, a vacuum line may conduct a vacuum from an upper chuck element edge port which is cross-drilled into the edge of the chuck element and connected with a machined groove extending in a circular manner around the bottom surface and interconnecting with through holes (apertures) 84 extending to the upper (device under test engaging) chuck surface 82. Several similar machined grooves may extend from near the edge of the bottom surface toward the center of the bottom surface, and interconnect with circular machined grooves and multiple through holes extending to the upper surface 82. The machined groove, for example, extends from near the edge to the center of the (circular) bottom surface and interconnects several holes 84 near the center of the surface.

The vacuum hole positions and corresponding machined grooves may be sufficient for holding thick wafers that bridge over multiple holes 84, but may not be sufficient for pulling down and holding warped wafers, thinned wafers, or shards of wafers. Preferably, wafers and devices under test should be held to the chuck upper surface with high force for uniformity of electrical contact with the wafer or device under test. The area in contact on the device under test is a variable in the measured resistance and is to be held as constant as possible. Machined grooves directly under the wafer or device under test (to the extent that the upper chuck surface comprises machined grooves instead of or in addition to vacuum holes for conducting vacuum to pull down the wafer or device under test) comprise voids under the wafer that are large enough to create errors in electrical measurements due to changes in contact resistance and in the creation of RF noise. Likewise, vacuum holes may comprise similar voids (sometimes referred to as RF voids), and therefore similar sources of error. Further, if the contact force of the wafer to the chuck varies due to non-uniformities in vacuum across the wafer, measurements of the device under test will vary. Such measurement variations can invalidate modeling of the device under test.

A vacuum hole for holding a wafer to the chuck has a limited area of effect where the full force of the vacuum is applied. Preferably, the vacuum holes positioned across the wafer-engaging surface of the upper chuck element are spaced close enough to have overlapping areas of full effect and uniform spacing around the entire wafer-engaging surface. Preferably, to achieve a full and uniform vacuum effect the vacuum holes are spaced approximately 0.38 inches apart or less over the entire chuck wafer/DUT-engaging surface. Also preferably, the vacuum may be applied to multiple zones in the chuck top allowing shards and different sized wafers to be held with sufficient vacuum.

In preferred embodiments, the wafer-engaging surface (or chuck top) 82 includes apertures 84 that are positioned with relation to one another so as to (collectively) create overlapping areas of vacuum effect across the wafer-engaging portion (or the entire wafer) of the surface 82. The chuck top 82 effectively provides what may be described as an "uninterrupted hole pattern chuck top" for holding wafers during testing. Such a hole pattern allows for delivery of a stronger and more uniform level of vacuum pressure to the supported wafer (and devices under test thereon). The stronger vacuum pressure and more uniform distribution across the wafer surface improve the electrical contacts and characteristics associated with probing and testing the wafer and the devices under test thereon. For example, such a chuck top surface 82 allows for more uniform/lower electrical contact resistance and inductance, more uniform contact areas, more even vacuum distribution across each device under test and between each device under test, more complete or full mechanical support for thinned wafers or shards of wafers, and for use of smaller aperture sizes and thus smaller voids presented to the underside of the wafer, thereby further reducing sources of RF noise.

In one embodiment of a bottom surface vacuum channel pattern for the downwardly facing surface of the upper chuck assembly element, the bottom surface incorporates machined (or otherwise foamed) channels which conduct vacuum from holes that penetrate through to corresponding apertures 84. The holes are positioned so as to be spaced apart in a substantially correspondingly opposite fashion as for the surface 82, with circular machined grooves (or channels) interconnecting regions of holes. In preferred embodiments, deeply cross-drilled inner channels conduct vacuum to the circular grooves, and selectively and controllably applying vacuum to the inner channels allows for maintaining strong and uniformly applied vacuum across the wafer-engaging surface 82. Such deep cross-drilling of a chuck top plate has heretofore been viewed as too difficult (to controllably and accurately cross-drill as much as four inches or more into a 0.23 inch thick chuck top) or unnecessary because the characteristics associated with stronger and more uniform vacuum, flatness of the chuck top surface, impact of top surface voids, and other characterizations were not previously discovered.

A vacuum line, for example, may conduct a vacuum from an upper chuck element edge port, which is cross-drilled into the edge of the chuck element (or otherwise formed as an inner channel) and connected with a machined (or etched or otherwise formed) groove extending in a circular manner around the bottom surface and interconnecting with through holes (apertures) that are proximate to the groove and extend to the upper (device under test engaging) chuck surface 82. Preferably, multiple inner channels are used to discretely and separately control vacuum for separate groups of the holes. For example, vacuum from one group of holes such as those interconnected with the outermost circular channel may be selectively controlled by edge vacuum connection; vacuum from another group of holes such as those connected with one or more of the interior surface circular channels may be selectively controlled by an edge vacuum connection; and yet another group of holes such as those centrally positioned holes may be selectively controlled by an edge vacuum connection. Each of the different crossdrilled internal vacuum lines may be connected at the edge connections with vacuum lines such as the lines 90a, 90b, 90c described and shown in FIG. 6. Auxiliary chucks such as aux chucks 92 and 94 also shown in FIG. 6, or any wafer or device under test engaging chuck surface having vacuum holes may incorporate the vacuum and other related improvements described herein. For example, the aux chuck 92, 94 holes 104 preferably comprise holes positioned for improved performance.

In preferred embodiments, a porous sintered metal chuck top 82 may be used as a vacuum distributor. A wafer-engaging surface such as the chuck top surface 82 preferably incorporates a continuous and uniform layer of porous (conductive) material having micron sized pores through which a vacuum may be drawn so as to strongly hold a wafer or device under test thereon. Supporting the porous layer is preferably a vacuum distributing (grooved) plate having a surface. The grooved plate preferably includes (machined, etched, or otherwise foamed) surface channels for conducting a vacuum for the porous layer The grooved plate preferably includes circular channels forming groups of channels which are interconnected with internal cross-drilled vacuum lines. Vacuum lines may be connected to the edge connections for each of the separately controllable vacuum lines and channels so as to allow selective control of the vacuum provided to particular regions of pores/holes (or vacuum zones) in the porous layer.

Alternatively, instead of cross-drilled internal vacuum lines, through holes providing vacuum to each of the separate regions may be used. For example, the vacuum channel and other channels on the grooved plate may be supplied vacuum using through holes extending from the channel on the surface to the back or lower side of the grooved plate. The through holes (not shown) may then be interconnected with channels formed in the back or lower side of the grooved plate or with vacuum paths from lower layers (or stages) of the chuck.

A porous wafer-engaging surface allows for greater uniformity of vacuum force applied to the wafer or device under test, and flexibility for holding shards of wafers, warped wafers, or wafers of varying sizes. Further, the porous surface improves the electrical contact characteristics for the device under test. The micro sized pores and uniform vacuum improves support of the wafer in the areas of the device under test that may include measurement pads and test pad structures. If the wafer surface under the device under test is not fully supported due to voids or leakage of vacuum due to roughness of the lower surface of the wafer, there may be, as previously mentioned, variation in the contact force of the wafer to the (porous) chuck surface and, consequently, variations in the measurements which may invalidate modeling of the device under test. The micron sized pores/holes in the porous surface create voids under the wafer and device under test which are less significant relative to the pitch of the measurement pads and test pad structures typically used.

A grooved (or micro-grooved) planar upwardly-facing wafer-supporting surface 82 of an upper chuck assembly element may incorporate vacuum grooves 84, preferably at least as small as 50 microns wide by 15 microns deep. The grooves may be machined, chemically etched, laser cut, or otherwise formed within the wafer-engaging surface 82, and the grooves are preferably sized so as to be nearly as narrow (i.e. 50 microns or less) as the thinnest of wafers typically used in semiconductor processing. The grooves 84 may be supplied vacuum as described herein. Preferably, the pattern of grooves 84 comprises circular grooves that are closely spaced with respect to one another and interconnected in groups (or zones) of grooves that are separately selectively controllable so as to allow sufficient vacuum retention of irregular-sized shards and different sized wafers.

Generally, wafers are preferably held to the chuck surface 82 with high force for uniformity of electrical contact. The area in contact on the device under test (DUT) is a variable in the DUT's measured resistance and is preferably held constant. Conventionally machined grooves are typically 300 to 3000 microns wide and comprise cavities (or voids) under the wafer that are large enough to create errors in electrical measurements due to changes in contact resistance and in the creation of RF noise. The cavities created under the wafer with such typically machined vacuum grooves may cause variations in the termination of the measurements electric field and of the fringing capacitance of the measurement. These variations may invalidate modeling of the device under test.

The grooves in the micro-grooved surface 82, however, are preferably at least as small as 50 microns (in width) which is nearly as narrow as the thinnest wafers typically used in semiconductor processing. The micro-grooves 84 are preferably positioned with close enough spacing so as to provide a continuous or uniform vacuum field and uniform contact area for supporting the wafer with no voids/cavities which may be significant in size relative to the pitch of measurement pads used. Preferably, the percentage of the area of the wafer directly below the device under test and test pad structures that are not in contact with wafer-supporting portions of the surface 82 (such as the area over a vacuum groove) is kept very small (i.e. insignificant) as compared to the percentage of required error in the measurement.

Conventional wafer vacuum chucks typically use machined grooves varying from 300 to 3000 microns in width to conduct the vacuum directly under the wafer or use an added top plate with a limited number of discrete holes/apertures to conduct the vacuum. The large and widely spaced machined grooves are better suited for holding thick wafers that can bridge over the groove and may exert sufficiently strong vacuum for such thick wafers. However, such designs may fail to pull down and adequately hold warped wafers or shards of wafers and may cause physical damage to thin wafers if the force of vacuum is too great. Using vacuum holes instead of machined grooves in the planar upwardly-facing wafer-supporting surface of an upper chuck assembly may reduce the magnetic/electric field void and thin wafer damage concerns.

The micro-grooved surface 82 preferably combines the strong vacuum holding capability of grooved wafer-engaging surface designs and the thin wafer mechanical/physical support and electric and magnetic field advantages of vacuum hole wafer-engaging surface designs, while improving uniformity of vacuum holding force and uniformity of mechanical and electrical contact characteristics with the wafer.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3A and 3B, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3A, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably, the spacers and washers 85 and 86, respectively, are constructed of a material having the lowest possible dielectric constant consistent with high dimensional stability and high volume resistivity. A suitable material for the spacers and washers is glass epoxy, or acetyl homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108*a*, 108*b* and 110*a*, 110*b*, respectively, electrically insulated from each other, with the connector elements 108*b* and 110*b* preferably coaxially surrounding the connector elements 108*a* and 110*a* as guards therefore. If desired, the connector assemblies 108 and 110 can be triaxial in configuration so as to include respective outer shields 108*c*, 110*c* surrounding the respective connector elements 108*b* and 110*b*, as shown in FIG. 7. The outer shields 108*c* and 110*c* may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108*a* and 110*a* are electrically connected in parallel to a connector plate 114 matingly and detachably connected along a curved contact surface 114*a* by screws 114*b* and 114*c* to the curved edge of the chuck assembly element 80. Conversely, the connector elements 108*b* and 110*b* are connected in parallel to a connector plate 116 similarly matingly connected detachably to element 81. The connector elements pass freely through a rectangular opening 112*a* in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 119 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122*a*, 124*a* are detachably connectable to the connectors 122 and 124 from suitable test equipment such as a Hewlett Packard 41428 modular DC source/monitor or a Hewlett Packard 4284A precision LCR meter, depending upon the test application. If the cables 119 and 120 are merely coaxial cables or other types of cables having only two conductors, one conductor interconnects the inner (signal) connector element of a respective connector 122 or 124 with a respective connector element 108*a* or 110*a*, while the other conductor connects the intermediate (guard) connector element of a respective connector 122 or 124 with a respective connector element 108*b*, 110*b*.

With sufficiently high probing voltages, such as 5,000 volts, 10,000 volts, or more, the different layers of the chuck tend to arc or otherwise short with one another. In addition, with such sufficiently high probing voltages the different layers of the chuck tend to arc or otherwise short with other structures in the vicinity to the chuck. In either case, a suitable chuck is required for probing at such extreme voltage levels.

One technique to increase the voltage capabilities of a chuck is to significantly increase the thickness of each of the layers within the chuck. While this may appear to be an appropriate technique, however, such a single pronged technique has significant limitations. This results in a significantly thicker chuck assembly that may be too thick to be operational within existing probing stations. In many cases, it is desirable to test integrated circuits at significantly elevated temperature such as 200 degrees Celsius, 300 degrees Celsius, or more. As the mass of the chuck increases, it becomes increasingly more difficult to accurately control the temperature of the chuck. In particular, it becomes increasingly more difficult to maintain the upper surface of the chuck at a desired temperature. Accordingly, it is generally undesirable to substantially increase the thickness of the layers of the chuck.

In general, as the distance between a pair of conductors separated by an air gap increases, the voltage level that is necessary to cause a breakdown between the spaced apart conductors increases. In this manner, it is generally preferable for a chuck to have conductors or other conductive members spaced apart by a sufficient distance to reduce the likelihood of high voltage breakdown. This provides a design criteria for a high voltage chuck.

In general, creepage is the shortest path between two conductive parts (or between a conductive part and the bounding surface) measured along the surface of the insulation between the two conductive parts. With a sufficiently high applied voltage, the creepage results in a partially conducting path of localized deterioration on the surface of an insulating material as a result of the electric discharges on or close to an insulation surface. In this manner, it is generally preferable for a chuck to have conductors or other conductive members spaced apart a sufficient distance to reduce the likelihood of high voltage breakdown as a result of creepage. In general, the creepage distance is twice that of the breakdown as a result of an air gap. This provides yet another design criteria for a high voltage chuck.

In addition, as the temperature at which testing occurs increases the greater the distance that is required between conductive members and/or creepage distances. In this manner, at high testing temperatures the design problems are increased.

Figure 8:
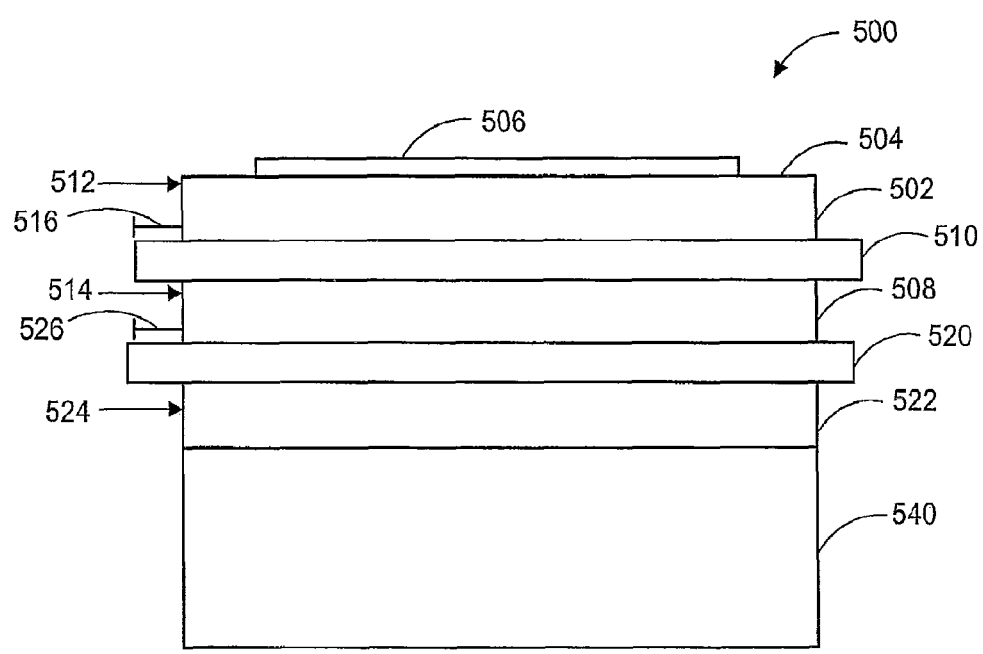
FIG. 8 illustrates a high voltage chuck.

Referring to FIG. 8, a chuck 500 typically includes a planar upper chuck assembly element 502 the upper surface 504 of which is suitable to support a device under test (DUT) 506. The upper chuck assembly element 502 and/or device under test 506 is preferably connected to a signal potential. For a chuck suitable for controlled high temperature measurements, the upper chuck element 502 is preferably constructed from aluminum and is approximately 0.23 inches thick. In general, the upper chuck element 502 is preferably from approximately 0.1 inches thick to approximately 0.5 inches thick, in order to maintain a relatively compact chuck and maintain a relatively low mass chuck assembly where the temperature is more readily controllable. Other materials and thicknesses may likewise be used. It is noted that FIG. 8 and other similar figures are for illustration and thus not to scale.

The chuck typically also includes a planar middle chuck assembly element 508. The middle chuck assembly element is preferably connected to a guard potential. For a chuck suitable for controlled high temperature measurements, the middle chuck assembly element 508 is preferably relatively thin, such as 0.01 inch thick conductive foil. In general, the middle chuck assembly element 508 is preferably from approximately 0.05 to 0.02 inches thick in order to maintain a relatively compact chuck and maintain a relatively low mass chuck assembly where the temperature is more readily controllable. Other materials and thicknesses may likewise be used.

The chuck typically also includes an upper chuck insulating element 510 positioned between the upper chuck assembly element 502 and the middle chuck assembly element 508. For a chuck suitable for controlled high temperature measurements the upper chuck insulating element 510 is preferably constructed from Boron Nitride having a dielectric constant of approximately 4.1. For a chuck suitable for controlled high temperature measurements, the upper chuck insulating element 510 is preferably relatively thin, such as 0.17 inches thick. In general, the upper chuck insulating element 510 is preferably from approximately 0.05 to 0.4 inches thick in order to maintain a relatively compact chuck and maintain a relatively low mass chuck assembly where the temperature is more readily controllable. In addition, the upper chuck insulating element 510 preferably has a dielectric constant from approximately 3 to approximately 6. Other materials and thicknesses may likewise be used.

With such high voltages potentially being applied during testing, it is desirable to increase the arc distance between the upper chuck assembly element 502 and the middle chuck assembly element 508 by extending the upper chuck insulating element 510 past the exterior surface 512 of the upper chuck assembly element 502 and past the exterior surface 514 of the middle chuck assembly element 508. The extension 516 of the upper chuck insulating element 510 increases the arc distance and increases the creepage distance between the upper and middle chuck assembly elements 502 and 508, without increasing the thickness of the chuck or otherwise substantially increasing the mass of the chuck assembly. The extension 516 of the upper chuck insulating element 510 is preferably at least approximately 0.1 inches, and more preferably approximately 0.25 inches, and preferably less than approximately 0.75 inches. Depending on the thickness of the upper chuck insulating element 510, the extension 516 is preferably approximately the same thickness of the upper chuck insulating element 510, more preferably approximately 2-3 times the thickness of the upper chuck insulating element 510, and more preferably approximately no greater than 5 times the thickness of the upper chuck insulating element 510. Other materials and thicknesses may likewise be used.

The chuck typically also includes a lower chuck insulating element 520 positioned between the middle chuck assembly element 508 and a lower chuck assembly element 522. For a chuck suitable for controlled high temperature measurements, the lower chuck insulating element 520 is preferably constructed from Boron Nitride having a dielectric constant of 4.4. For a chuck suitable for controlled high temperature measurements, the lower chuck insulating element 520 is preferably relatively thin, such as 0.17 inch thick. In general, the lower chuck insulating element 520 is preferably from approximately 0.05 to 0.3 inches thick in order to maintain a relatively compact chuck and maintain a relatively low mass chuck assembly where the temperature is more readily controllable. In addition, the lower chuck insulating element 520 preferably has a dielectric constant from approximately 3 to approximately 6. Other materials and thicknesses may likewise be used.

The chuck typically also includes a planar lower chuck assembly element 522. The lower chuck assembly element 522 is preferably connected to a shield and/or ground potential. For a chuck suitable for controlled high temperature measurements, the lower chuck assembly element 522 is preferably relatively thin, such as 0.01 inch thick conductive foil. In general, the lower chuck assembly element 522 is preferably from approximately 0.005 to 0.02 inches thick in order to maintain a relatively compact chuck and maintain a relatively low mass chuck assembly where the temperature is more readily controllable. Other materials and thicknesses may likewise be used.

With such high voltages potentially being applied during testing, the chuck may increase the arc distance between the middle chuck assembly element 508 and the lower chuck assembly element 522 by extending the lower chuck insulating element 520 past the exterior surface 524 of the lower chuck assembly element 522 and past the exterior surface 514 of the middle chuck assembly element 508. The extension 526 of the lower chuck insulating element 520 increases the arc distance and increases the creepage distance between the middle and lower chuck assembly elements 508 and 522, without increasing the thickness of the chuck or otherwise substantially increasing the mass of the chuck assembly. The extension 526 of the lower chuck insulating element 520 is preferably at least approximately 0.1 inches, and more preferably approximately 0.25 inches, and preferably less than approximately 0.75 inches. Depending on the thickness of the lower chuck insulating element 520, the extension 526 is preferably approximately the same thickness of the lower chuck insulating element 520, more preferably approximately 2-3 times the thickness of the lower chuck insulating element 520, and more preferably approximately no greater than 5 times the thickness of the lower chuck insulating element 520. Other materials and thicknesses may likewise be used. In many cases, the extension 526 of the lower chuck insulating element 520 may be omitted.

The chuck 500 may be supported by a thermal chuck 540. The thermal chuck 540 may increase and/or decrease the temperature applied to the chuck 500 supported thereon. The thermal chuck may apply any suitable temperature, such as for example, 200 degrees Celsius, 300 degrees Celsius, or more. In order to maintain the various layers of the chuck 500 in their various positions relative to one another, it is desirable that this is accomplished in a manner that does not otherwise significantly degrade the performance of the chuck at high voltages and/or extreme temperatures. While screws securing one layer to another are suitable for lower voltage levels, such screws tends to result in significantly changing the electrical characteristics of the chuck. To overcome this limitation, all or a portion of, the layers of the chuck may be partially or fully maintained together using a vacuum.

Figure 9:
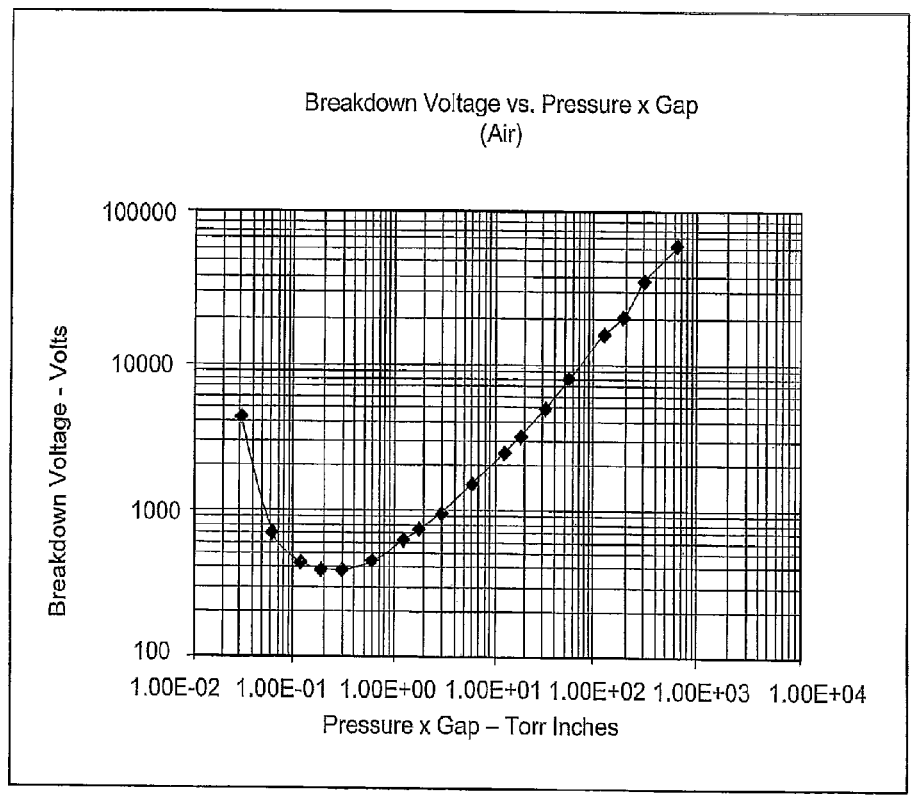
FIG. 9 illustrates a breakdown voltage versus pressure x gap curve.

Referring to FIG. 9, the breakdown voltage between a pair of parallel plates, such as between a pair of conductive surfaces on either side of a vacuum path, has a non-linear characteristic. The voltage necessary to arc across the gap decreases up to a point as the pressure is reduced. Then the voltage necessary to arc across a gap increases, gradually exceeding its original value. In addition, decreasing the gap with normal pressure results in the same behavior in the voltage needed to cause the arc. Accordingly, it is not desirable to include long vacuum lines, nor is it desirable to include vacuum lines that interconnect a pair of conductive plates on either side of an insulating layer, nor is it desirable to include vacuum lines that otherwise pass though a region of different voltage potentials.

Figure 10:
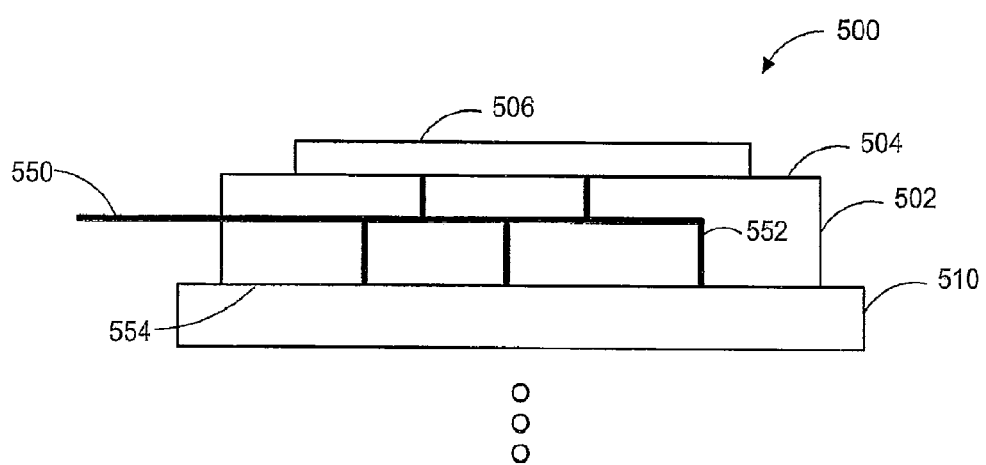
FIG. 10 illustrates an upper portion of the high voltage chuck with vacuum lines.

Referring to FIG. 10, a vacuum line 550 may be attached to the upper chuck assembly element 502 which defines one or more paths 552 therein. The paths 552 preferably provide vacuum to the upper surface 504 so that the device under test 506 may be secured in place, while also providing vacuum to the lower surface 554 to maintain the upper chuck assembly element 502 to the upper chuck insulating layer 510. Accordingly, the device under test 506, the upper chuck assembly element 502, and the upper chuck insulating layer 510 are maintained in a fixed relationship with respect to one another while testing the device under test. The vacuum provided to the upper surface 504 and the lower surface 554 may be interconnected or may be isolated from one another. In addition, the vacuum provided to the upper surface may be selectively provided to one or more zones depending on the size of the device under test 506.

Figure 11:
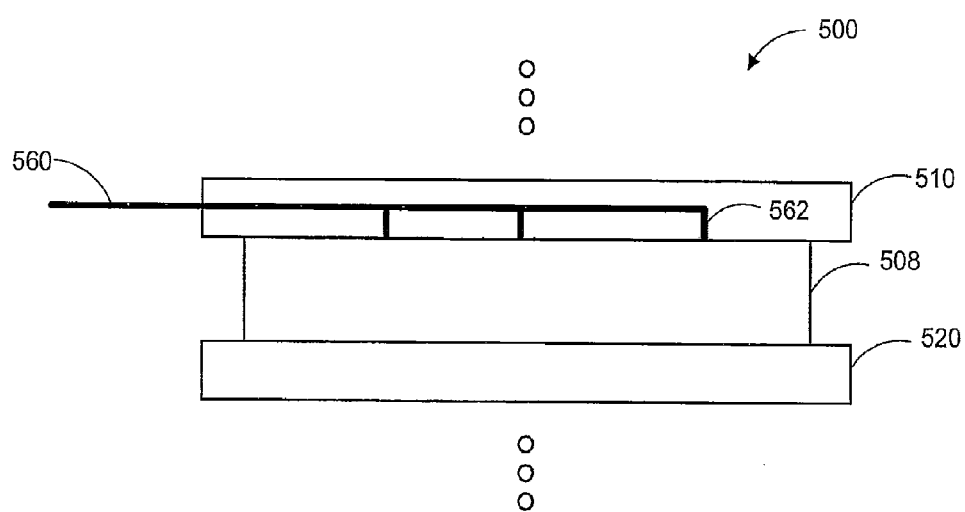
FIG. 11 illustrates a middle portion of the high voltage chuck with vacuum lines.

Referring to FIG. 11, a vacuum line 560 may be attached to the upper chuck insulating layer 510 which defines one or more paths 562 therein. The paths 562 preferably provide vacuum to the middle chuck assembly element 508 to maintain the upper chuck insulating layer 510 to the middle chuck assembly element 508. Accordingly, the device under test 506, the upper chuck assembly element 502, the upper chuck insulating layer 510, and the middle chuck assembly element 508 are maintained in a fixed relationship with respect to one another while testing the device under test. In some cases, the middle chuck assembly element 508 may include perforations therein. In this case, the vacuum is also provided to the lower chuck insulating layer 520, thereby maintaining it in a fixed relationship with respect to the other layers.

Figure 12:
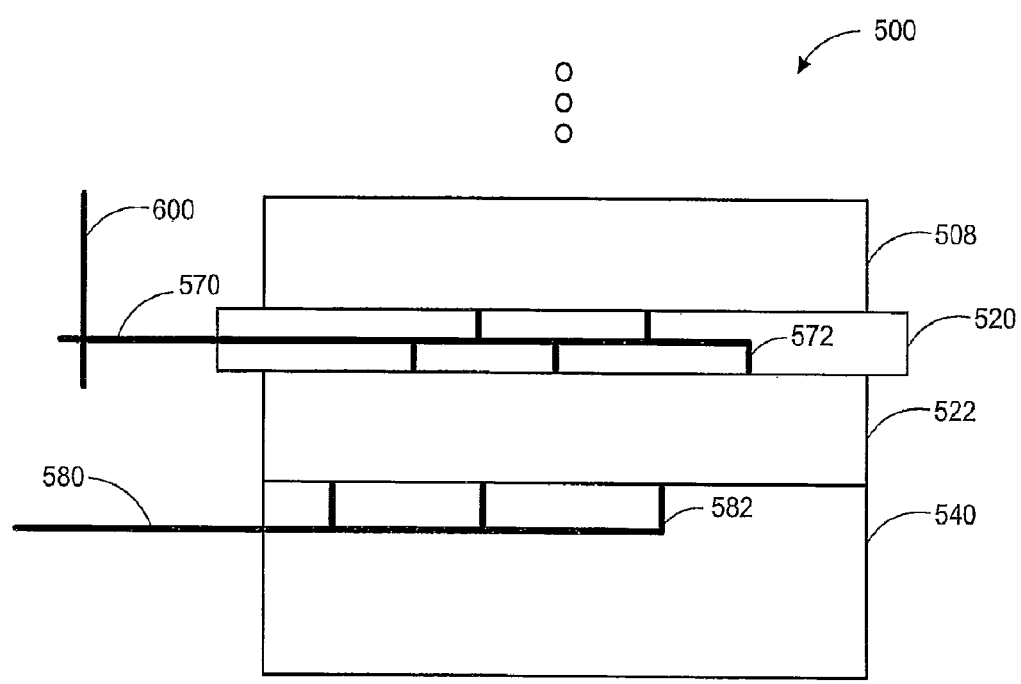
FIG. 12 illustrates a lower portion of the high voltage chuck with vacuum lines.

Referring to FIG. 12, a vacuum line 570 may be provided to the lower chuck insulating layer 520 which defines one or more paths 572 therein. The paths 572 preferably provide vacuum to the middle chuck assembly element 508 to maintain the lower chuck insulating layer 520 to the middle chuck assembly element 508, if desired. The paths 572 preferably provide vacuum to the lower chuck assembly layer 522 to maintain the lower chuck insulating layer 520 to the lower chuck assembly layer 522, if desired. In some cases, the lower chuck assembly layer 522 may include perforations therein. In this case, the vacuum is provided to the thermal chuck 540, thereby maintaining it in a fixed relationship with respect to the other layers. Depending on the configuration, the lower chuck assembly layer 522 may be omitted.

A vacuum line 580 may be provided to the thermal chuck 540 which defines one or more paths 582 therein. The paths 582 preferably provide vacuum to the lower chuck assembly layer 522 to maintain the lower chuck assembly layer 522 to the thermal chuck 540. The paths 582 are maintained within the thermal chuck 540 so the paths 582 are in a zone having the same potential, normally a shield and/or ground potential. In the case that the lower chuck assembly layer 522 includes perforations therein, the thermal chuck 540 is maintained in a fixed relationship with the lower chuck assembly layer 522 and the lower chuck insulating layer 520.

In general, the upper chuck assembly element includes vacuum paths therein. The upper chuck insulating layer 510 and/or the lower chuck insulating layer 520 and/or the thermal chuck 540 may include vacuum paths therein to suitable layers in order to maintain the integrity of the chuck 500. In some configurations, a ring 600 is provided that encircles the chuck 500. The ring 600 is preferably interconnected to a guard potential which is the same potential to which the vacuum line 560 and paths 562 extent to, namely, the guard potential of the middle chuck assembly element 508.

Figure 13:
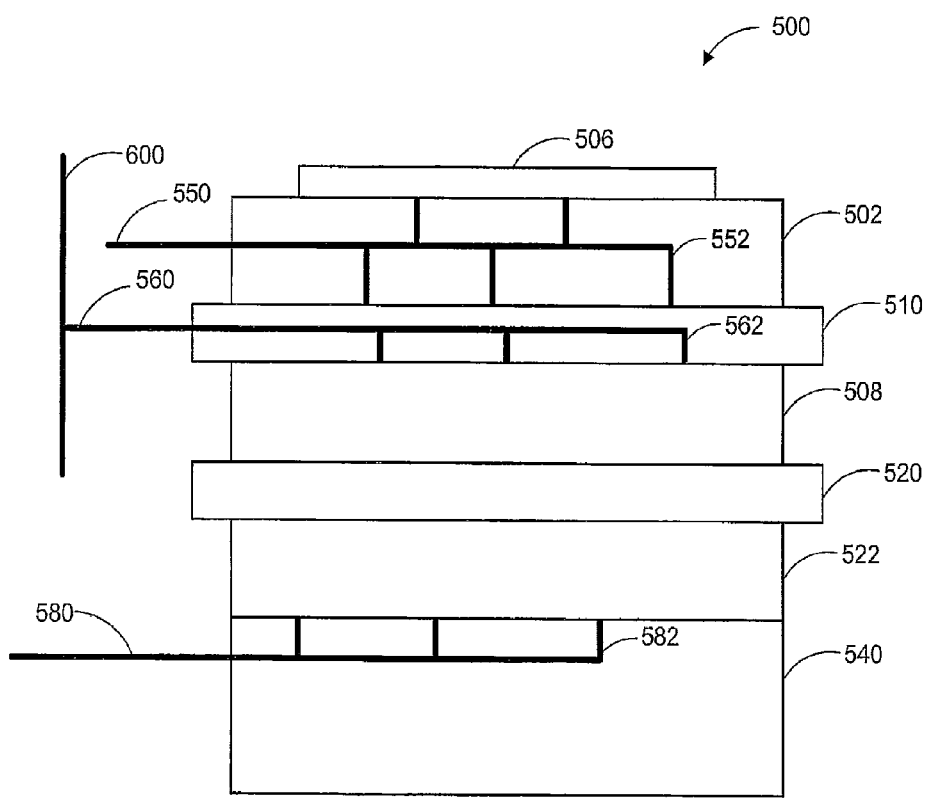
FIG. 13 illustrates a high voltage chuck with vacuum lines.

Referring to FIG. 13, the preferred arrangement of vacuum paths is such that there are no paths that extend from one side of an insulating layer to the other side of the insulating layer, thereby reducing the likelihood of an arc between the two sides of the insulating layer. With perforations within the middle chuck assembly element 508 and/or the lower chuck assembly layer 522, additional layers may be secured together while reducing the number of vacuum paths. In many cases, the surfaces of the layers may include paths defined therein to more evenly distribute the vacuum between the surfaces.

With a suitable chuck 500 configuration in a coaxial mode, 10,000 volts may be applied at 300 degrees Celsius without a substantial corona or arc discharge. The coaxial mode includes a signal applied to the upper chuck assembly element while the middle chuck assembly element and the lower chuck assembly element/thermal chuck are at a ground potential. In this configuration, the current leakage is preferably less than $10,000/10^{10}$.

With a suitable chuck 500 configuration in a triaxial mode, 3,000 volts may be applied at 300 degrees Celsius without a substantial corona or arc discharge. The triaxial mode include the upper chuck assembly element connected to a signal, the middle chuck assembly element connected to a guard potential, and the lower chuck assembly element/thermal chuck to a ground potential. In this (or other) configuration, the leakage current is preferably less than 10 pico amps, and more preferably less than 3 pico amps.

While the configuration of the boron nitride upper chuck insulating element 510 with an extension 516 reduces the high voltage breakdown, at sufficiently high temperatures and/or sufficiently high voltages a significant offset current results in the measurements. After analysis of the structure of the chuck together with the materials, it was determined that at least a partial source of the offset current is a result of stresses induced in the upper chuck insulating element 510. The center region of the upper chuck insulating element 510 has a temperature consistent with that applied by the thermal chuck 540 while the extension 516 has a temperature somewhat lower than the temperature of the central region of the upper chuck insulating element 510, resulting in a differential temperature. In addition to this differential temperature, the central region of the upper chuck insulating element 510 is maintained in position using a vacuum so that stresses are induced between the central region of the upper chuck insulating element 510 and the extension 516 region of the upper chuck insulating element 510. These induced stresses in the upper chuck insulating element 510 result in an induced voltage and current. The induced current tends to be on the order of 100 pico amps which is problematic for low current measurements.

Figure 14:
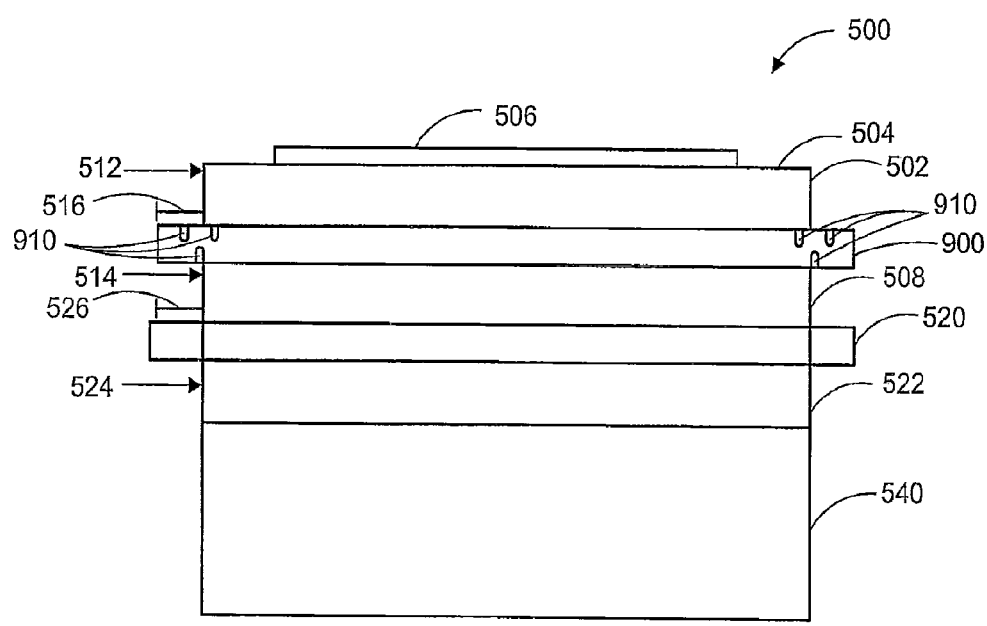
FIG. 14 illustrates a modified chuck.

Referring to FIG. 14, a modified upper chuck insulating element 900 includes one or more recesses 910 (otherwise the same as the upper chuck insulating element 510) defined therein proximate the exterior edge of the of the upper chuck assembly element 502 and/or exterior edge of the middle chuck assembly element 508. The recesses 910 may extend around a majority of, substantially all of, and/or all of the circumference of the upper chuck insulating element 900. One or more recesses 910 may be included on the upper side of the upper chuck insulating element, and/or the lower side of the upper chuck insulating element 900, and/or both the upper and lower sides of the upper chuck insulating element 900. As stresses are induced in the modified upper chuck insulating element 900 the recesses 910 tend to contract thus absorbing the stresses that would otherwise be induced in the upper chuck assembly element 900. Preferably, the recesses 910 extend at least ¼ of the thickness of the upper chuck insulating element 900, and more preferably ½ of the thickness of the upper chuck insulating element 900. In this manner, the offset current is significantly reduced.

Figure 15:
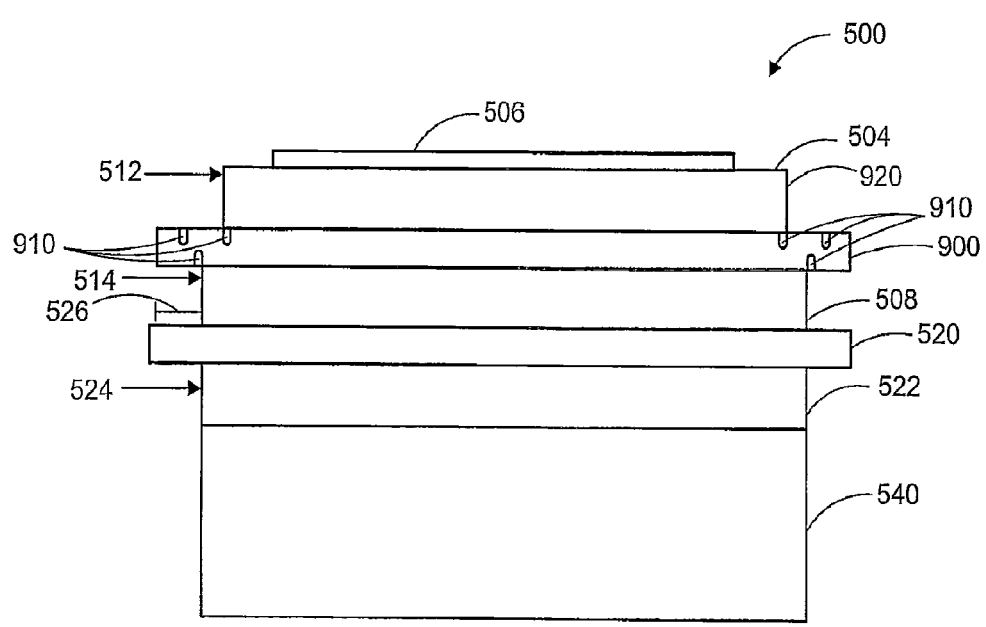
FIG. 15 illustrates another modified chuck.

Referring to FIG. 15, a modified upper chuck assembly element 920 may be sized such that it has a smaller diameter than both the upper chuck insulating element 900 and the middle chuck assembly element 508. In this manner, the temperature provided by the thermal chuck 540 may be more evenly distributed over the upper surface 504 of the upper chuck assembly element 920 to the device under test 506.

Figure 16:
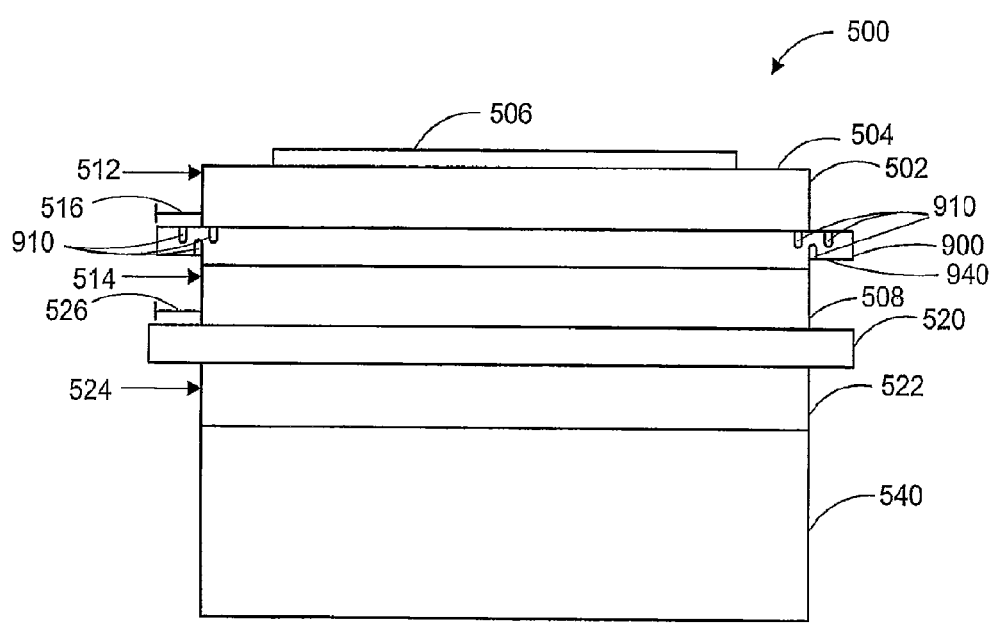
FIG. 16 illustrates another modified chuck.

Referring to FIG. 16, a modified upper insulating element 940 may include a first thickness across a majority of its diameter and a thinner thickness proximate the extension 516 portion of the upper insulating element 940. The thinner thickness reduces the stresses that are induced in the modified upper insulating element 940.

Figure 17:
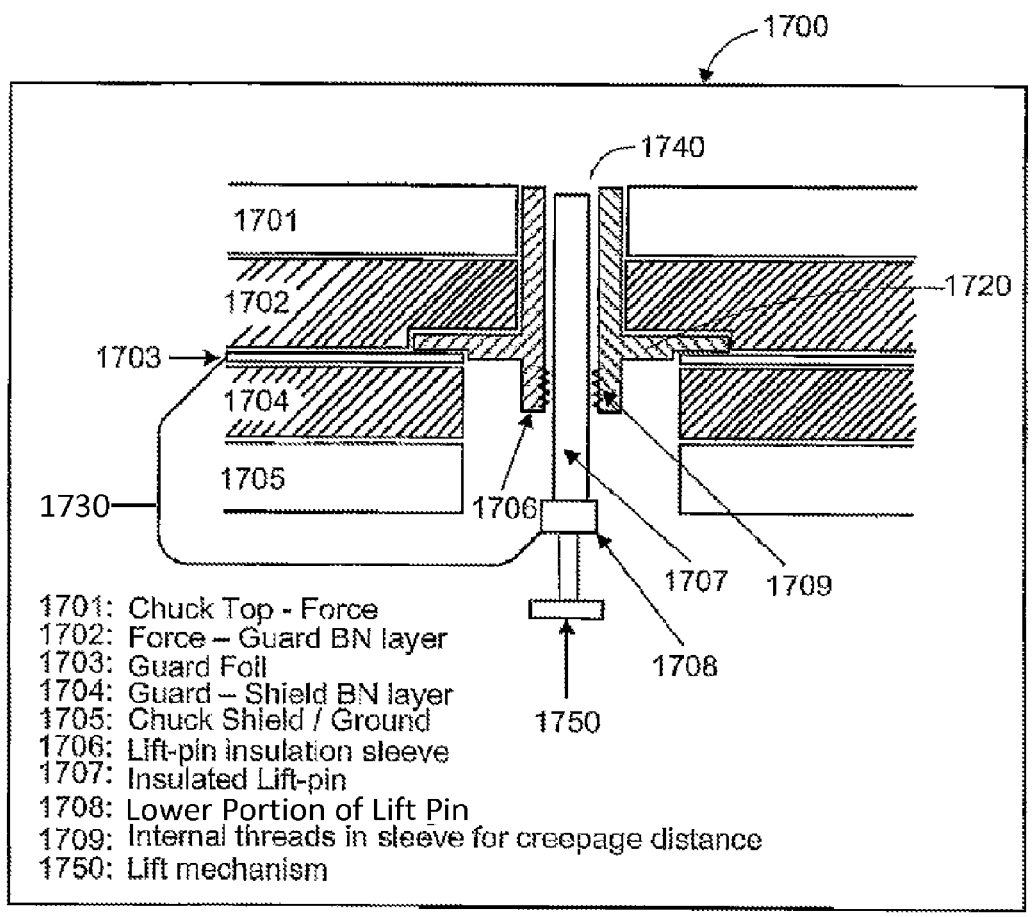
FIG. 17 illustrates a high voltage chuck with insulated and guarded lift pin.

When automatic wafer loading/unloading equipment is used, wafer lift pins are incorporated into the chuck. Referring to FIG. 17, a lift mechanism 1750 pushes lift pin 1707 upward through a lift pin hole 1740 in the wafer-supporting surface of the chuck top-force layer 1701. As shown in FIG. 17, a high voltage triaxial thermal chuck 1700 preferably includes an insulated and guarded lift pin 1707 in an insulated sleeve 1706 with the flange 1720 of the sleeve extending under the force-to-guard isolation layer 1702 to maintain the flashover (or arcing) and creepage distance required for high voltage applications. The flange 1720 preferably extends under the force-to-guard isolation layer 1702 so as to increase creepage distance between the conductive chuck top-force layer 1701 and the guard foil 1703. The sleeve 1706 may include internal threads 1709 or other surface area increasing features (e.g. sinusoidal or square wave shaped physical structure) to provide additional creepage distance between conductors. The sleeve 1706 is preferably positioned and sized so that it cannot make contact with the guard-to-shield isolation layer 1704 or the chuck shield/ground layer 1705. If the force-to-guard isolation layer 1702 comprises air or a highly resistive film as for application in a non-thermal chuck configuration, then the flange 1720 of the sleeve 1706 preferably extends far enough to maintain the flashover and creepage distances required for the voltage in the area of the lift pin hole 1740. The lift pin 1707 is preferably made from an insulation material, and the lift pin 1707 may or may not have a guard layer, shown in FIG. 17 as a wire 1730 from the guard foil 1703 and connected to a lower portion 1708 of the lift pin 1707.

Figure 18:
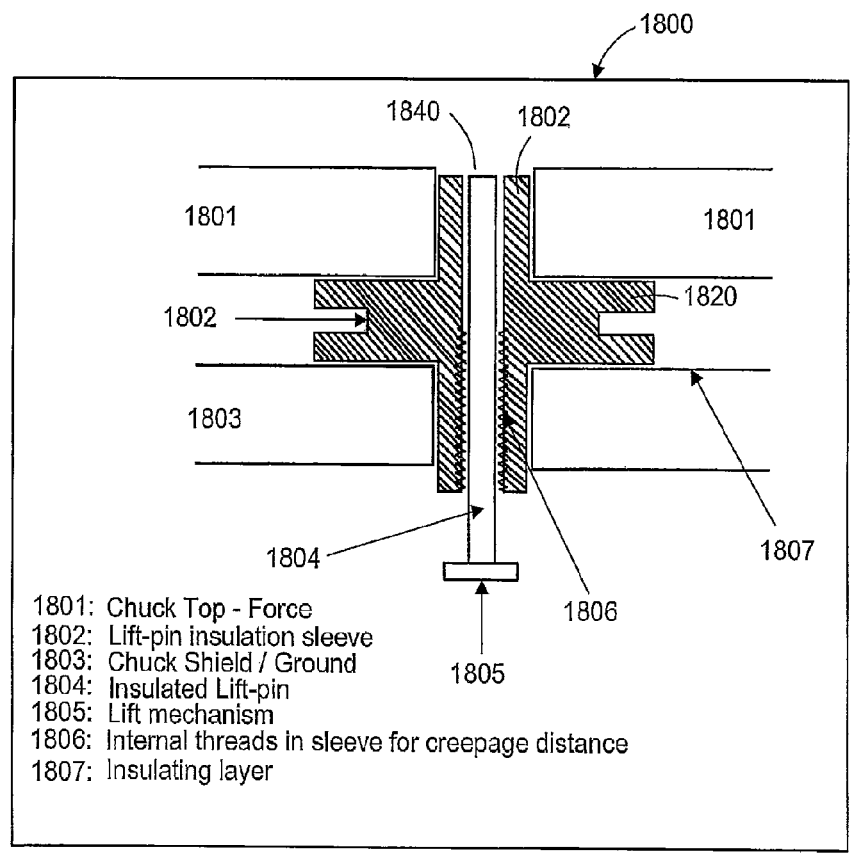
FIG. 18 illustrates a high voltage chuck with insulated lift pin.

Referring to FIG. 18, a high voltage non-thermal coaxial chuck 1800 preferably includes an insulated lift pin 1804 in an insulated sleeve 1802 with the flange 1820 of the sleeve extending under the chuck top-force layer 1801 to maintain the flashover (or arcing) and creepage distance required for high voltage applications. The flange 1820 preferably extends under the chuck top-force layer 1801 so as to increase creepage distance between the conductive chuck top-force layer 1801 and the chuck shield/ground layer 1803. The sleeve 1802 may include internal threads 1806 or other surface area increasing features (e.g. sinusoidal or square wave shaped physical structure) to provide additional creepage distance between conductors. The flange 1820, as shown in FIG. 18, incorporates a square wave shaped structure to provide additional creepage distance between the chuck top-force layer 1801 and the chuck shield/ground layer 1803. The flange 1820 shape also provides greater vertical separation to reduce high voltage arcing between conductors. If the force-to-guard isolation layer (not shown) comprises air or a highly resistive film as for application in a non-thermal chuck configuration, then the flange 1820 of the sleeve 1802 preferably extends far enough to maintain the flashover and creepage distances required for the voltage in the area of the lift pin hole 1840.

For typical triaxial measurements, the potential of the guard layer is held by a source-measure unit (SMU) to within a small potential of the force, typically within millivolts. A "quasi triaxial" measurement or "quasi guard" technique may be used for coaxial measurements whereby the guard potential is set (or held by a SMU) to a portion of the chuck top potential. For example, if the chuck top is at 10 kV, the guard may be set at 5 kV to effectively lower the breakdown potential by half. That is, if the chuck top is at 10 kV and the guard is set (or held) at 5 kV, the breakdown potential is effectively reduced from 10 kV to 5 kV, allowing chucks and probes to be more cost effectively manufactured and lowering the current leakage, leakage settling time, and noise for coaxial measurements.

In high voltage operation, the wafer-supporting surface of the chuck may be biased up to 10 kV and preferably does not breakdown electrically or exhibit electrical discharge to surrounding guard or shield structures. High voltage isolation between conductors is normally achieved by increasing the distance between the two conductors, both in terms of the air gap between the conductors and the creepage distance across the surface of any insulator that separates the conductors. Typically, thick isolators are used and are designed with a sinusoidal or square wave shaped edges to increase the surface creepage distance. At standard atmosphere and pressure, the creepage distance is typically the more restrictive design criteria for conductors separated by a physical isolator. For conductors remotely mechanically supported or well isolated, the air gap may be the limiting factor.

As the temperature and voltage increase, sharp edges of surfaces that are at high voltage potential have high intensity electric fields and can emit electrons in a corona discharge. Such discharge can disrupt leakage measurements and lead to high voltage breakdown.

Air spacing may be used for isolating various surrounding guard or shield structures. However, the air gap allowable is often limited by the physical constraints and size of the probe station and test chamber. Use of thick isolation material to prevent arcing may be used. However, if the isolator is not a low dielectric absorption material, there can be surface charge retention on the isolator that may become a cause of low noise measurement errors. Consequently, for low noise measurements, any surface facing the measurement conductor should not be able to hold a surface charge.

Figure 19A:
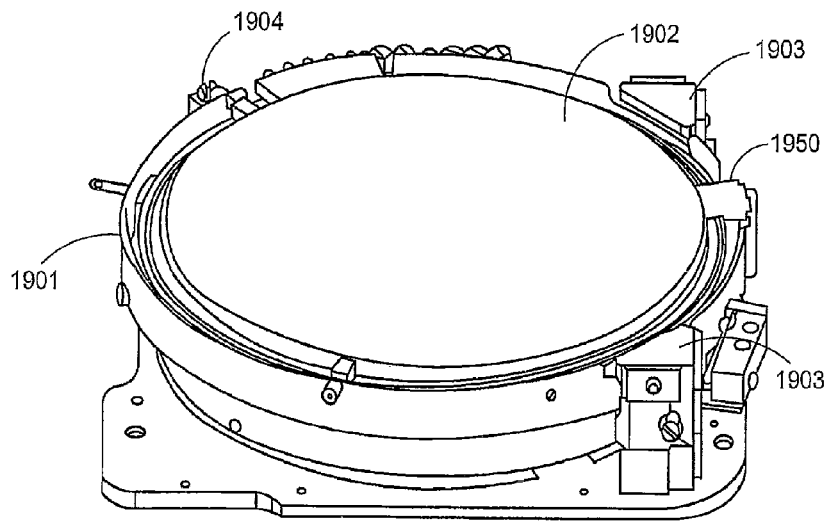
FIG. 19a illustrates an exemplary thermal chuck with auxiliary chucks, guard ring, and other structures in close proximity to the chuck top force/sense surface.
Figure 19B:
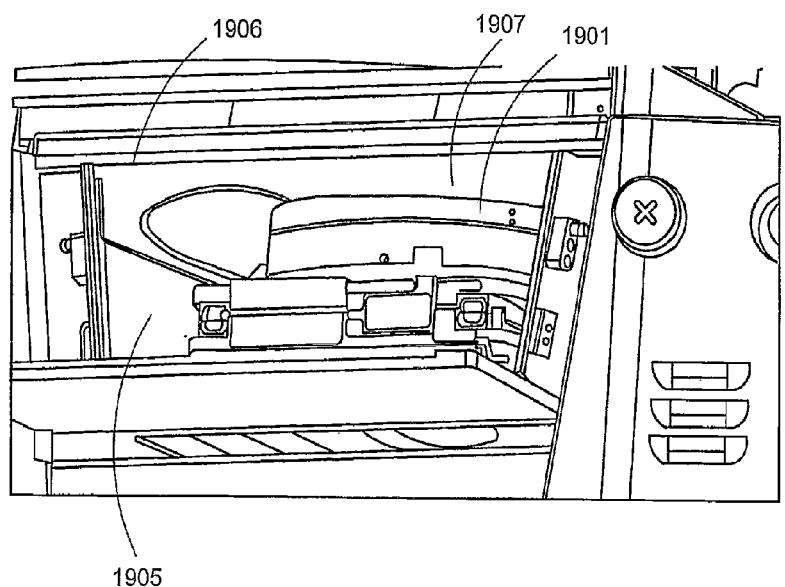
FIG. 19b illustrates an exemplary prober chamber with a guard ring and other chamber structures in close proximity to the chuck top force/sense surface.
Figure 19C:
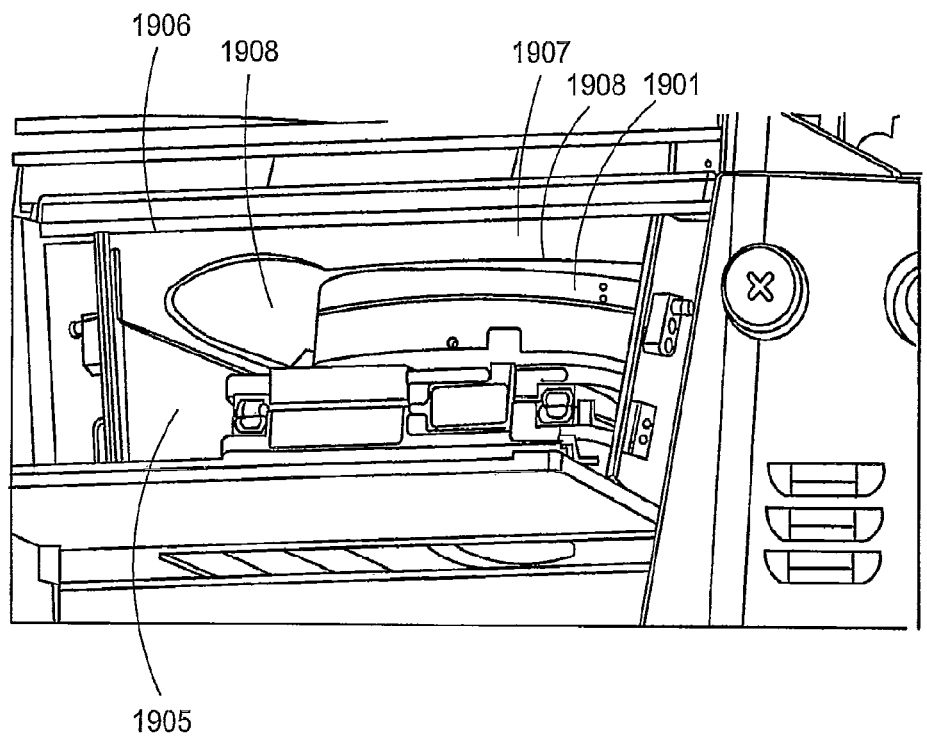
FIG. 19c illustrates an exemplary prober chamber with an upper guard, a guard ring, and other chamber structures in close proximity to the chuck top force/sense surface.
Figure 20A:
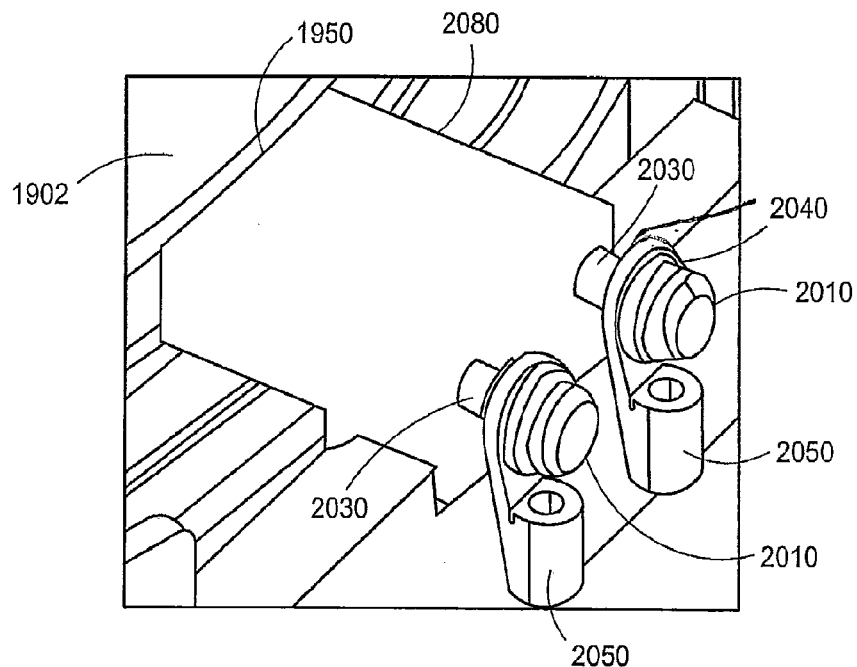
FIG. 20a illustrates a chuck top force/sense connection.
Figure 20B:
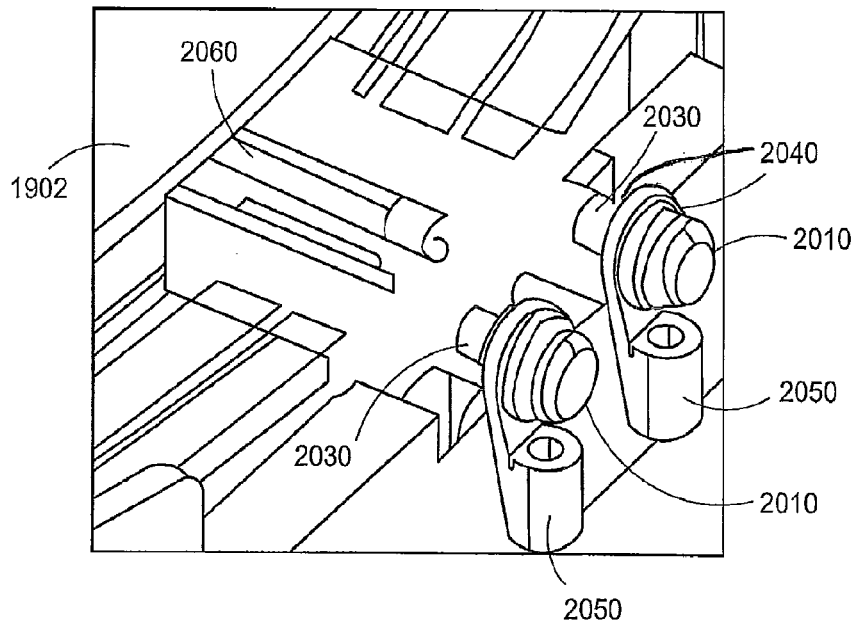
Figure 20C:
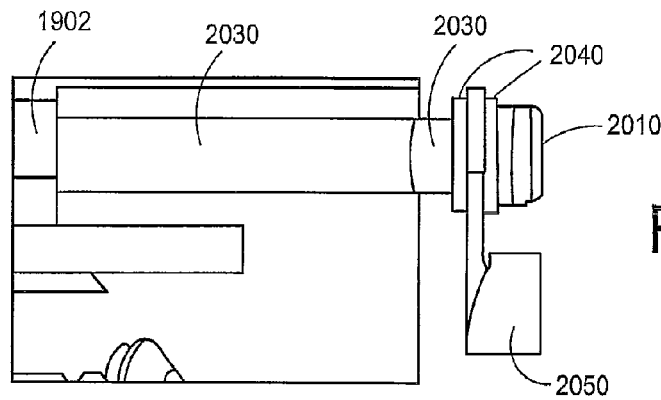
Figure 20D:
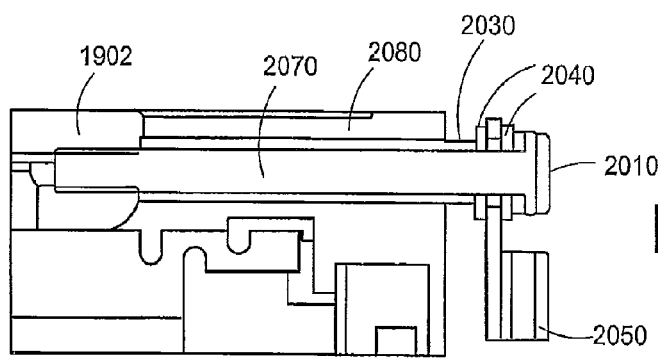
Figure 20E:
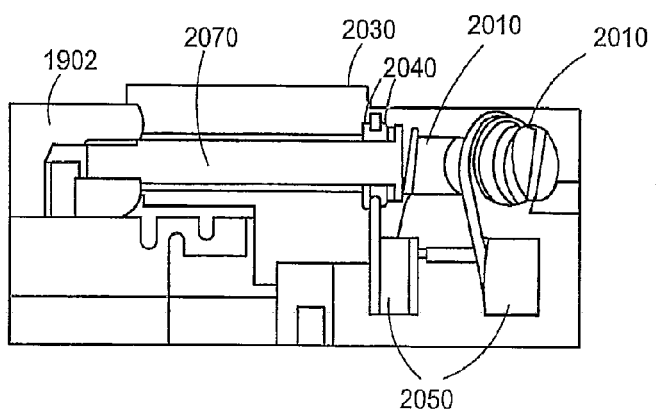

To ensure conductors in close proximity to the measurement surfaces of the chuck are sufficiently isolated, a thin nonconductive, low dielectric absorption coating is preferably applied on one or more of the following surfaces of the thermal chuck measurement system, as shown in FIGS. 19a-19c: the test chamber walls 1905, the guard ring 1901, the guard 1908, and preferably all of the guarding and shielding surfaces in close proximity to and not in direct contact with the chuck force/sense measurement surface 1902. Test chamber upper surfaces 1906 and upper structure 1907 are preferably similarly coated. The nonconductive coating, in addition to resisting arcing, also effectively contains the highest intensity electric fields, quenching the corona discharge effect.

In a preferred embodiment, the guard ring 1901, as shown in FIGS. 19a-19c, is coated with Hyphlon MFA, or PTFE, or equivalent high isolation, low dielectric absorption coating in the manufactures' recommended thickness for high voltage, in this case 0.005" or more. The low dielectric absorption and thin material allows surface charges to dissipate quickly, while the high isolation properties protect against high voltage arcing.

Other preferred embodiments include coating various combinations of chamber wall 1905 and upper surfaces 1906, guard plate 1908 and guard ring 1901, and/or other structures near the chuck such as the Aux chucks 1903, alignment cameras (not shown), or other structures (e.g. screw head 1904).

The chuck force/sense measurement surface 1902 is preferably connected, as shown in FIG. 19a, to force and sense cables in a Kelvin connection 1950 via an insulating or non-conductive block. Preferably, the Kelvin connection 1950 provides very low resistance, below a milliohm, in order to make low noise and or high current measurements, and maintain its operating characteristics in a highly stable manner over the full operating temperature range of the chuck (for example, from −65 Celsius to 300 Celsius) and over the operational life time of the high voltage chuck, and rejecting electrical breakdown at high voltage to surrounding structures.

Some designs use (for example, stainless steel or steel) hardware to connect the measurement wires/leads either directly to the chuck top or with a longer screw through an isolator block of a high temperature engineering isolation material (such as, for example, plastic or polyimide) or a ceramic material to the chuck. The difference between thermal expansion characteristics of the stainless steel screw and the aluminum chuck top, and/or the isolator block and stainless screw may cause the connection to loosen over time or with thermal cycling. High temperature engineering isolation materials typically have a coefficient of thermal expansion (CTE) greater than the screw and may yield somewhat at high temperatures causing a loss of clamping force and, thus, a loss in electrical contact in the bolted joint when temperatures fall back down. Ceramic isolators typically have a CTE much lower than the screw and may lose clamping force and therefore contact at high temperatures.

The resistance of a screw may be calculated by multiplying the material resistivity with the diameter and again the length of the screw. Stainless steel screws and their connection capabilities tend not to provide low enough resistance for advancing technologies in semiconductor wafer testing instruments and equipment. The disadvantage of such designs is compounded by the physical limits of screw diameters that can be used on the chuck top edge. Additionally, it is generally undesirable to increase the thickness of the chuck top layer to accommodate larger screw diameters due to the impact such increase has on the thermal mass and, thus, the thermal response of the chuck system.

Referring to FIGS. 20a-20e, a first group of preferred embodiments for the Kelvin connection 1950 include an insulating block 2080 or other electrically non-conductive cover attached to the chuck top 1902 in order to protect the measurement connections 2010 from arcing to surrounding structures. The measurement connections 2010 preferably pass through the insulating block 2080 without depending on the insulating block for clamping force and therefore electrical contact. All components of the electrical connection 2010 through the insulation block 2080 preferably have matching CTE's and, most preferably, are of the same material, for example, brass.

A first embodiment of this first group is shown in FIGS. 20a-20e and preferably includes a block 2080 of electrically insulating material attached to the chuck top 1902 with fasteners 2060 that are not the electrical connection. The electrical connection is made by a screw 2070 that extends thru a hollow standoff that extends beyond the insulating block 2080 and tightens onto the standoff to hold a continuous clamping force and therefore electrical contact to the chuck 1902. The screw, sleeve and washer 2040 materials are matched (for example, all made of brass) to better match the CTE of the aluminum chuck top 1902, and the additional conductor area added by the sleeve 2030 reduces the resistance of the connection by two to four times over the material change (from conventional designs using stainless steel) alone for a given screw size.

A second embodiment of this first group preferably includes a block of electrically insulating material attached to the chuck top 1902 with fasteners 2060 that are not the electrical connection. The electrical connection is made by an at least partially threaded stud 2070 that extends thru a hollow standoff and has a nut that tightens onto the standoff to hold a continuous clamping force and therefore electrical contact to the chuck 1902. The threaded stud, sleeve, nut, and washer materials are all preferably matched (and preferably are made of brass) to better match the CTE of the aluminum chuck top 1902, and the additional conductor area added by the sleeve 2030 reduces the resistance of the connection by two to four times over the material change alone for a given screw size. Additional nuts may be used to hold the wire lugs 2050 for attachment to measurement cables.

A third embodiment of this first group preferably includes a block of electrically insulating material attached to the chuck top 1902 with fasteners 2060 that are not the electrical connection. The electrical connection is made by an at least partially threaded stud 2070 that has a nut that tightens onto the chuck 1902 to hold a continuous clamping force and therefore electrical contact to the chuck. An additional pair of nuts may be used to hold the wire lugs 2050 for attachment to measurement cables. The screw, sleeve, nuts, and washer materials are preferably matched and are preferably brass, to better match the CTE of the aluminum chuck top 1902.

A fourth embodiment of this first group preferably includes a block of electrically insulating material attached to the chuck top 1902 with fasteners 2060 that are not the electrical connection. The electrical connection is made by a threaded standoff that screws into the chuck top 1902 or onto a stud in the chuck top 1902 and additionally a screw is used to hold the wire lugs 2050 for attachment to measurement cables to hold continuous clamping force and therefore electrical contact to the chuck. The screw, standoff, and washer materials are matched and preferably made of brass, to better match the CTE of the aluminum chuck top 1902, and the additional conductor area added by the threaded standoff reduces the resistance of the connection by two to four times over the material change alone for a given screw size.

A fifth embodiment of this first group preferably includes a block of electrically insulating material attached to the chuck top 1902 with fasteners 2060 that are not the electrical connection. The electrical connection is made from a block of conductive material attached to the chuck top 1902 and enclosed within the insulating block on at least 3 sides. A screw is used to hold the wire lugs 2050 for attachment to measurement cables to hold continuous clamping force and therefore electrical contact to the chuck 1902. The screw, conductive block, and washer materials are matched and in this case brass, to better match the CTE of the Aluminum chuck top, the additional conductor area added by the connection block reduces the resistance of the connection by at least two to four times over the material change alone for a given screw size.

Still referring to FIGS. 20a-20e, a second group of preferred embodiments for the Kelvin connection 1950 include an insulating sleeve 2030 or other electrically non-conductive cover attached over the measurement connections to prevent arcing to surrounding structures, without attaching the sleeve 2030 to the chuck top 1902. The measurement connections 2010 preferably pass through the insulating sleeve 2030 without depending on the insulating sleeve for clamping force and therefore electrical contact. All components of the electrical connection through the insulation sleeve preferably have matching CTE's and, most preferably, are of the same material, for example, brass.

A first embodiment of this second group preferably includes an insulating sleeve 2030 or other electrically non-conductive cover attached over the measurement connections to prevent from arcing to surrounding structures without attaching the sleeve 2030 to the chuck top 1902. The electrical connection is preferably made by a screw 2070 that extends thru a hollow standoff that extends beyond the insulating sleeve 2030 and tightens onto the standoff to hold a continuous clamping force and therefore electrical contact to the chuck 1902. The screw, hollow standoff, and washer materials are preferably matched and more preferably made of brass, to better match the CTE of the aluminum chuck top 1902, and the additional conductor area added by the sleeve reduces the resistance of the connection by two to four times over the material change alone for a given screw size.

A second embodiment of this second group preferably includes an insulating sleeve 2030 or other electrically non-conductive cover attached over the measurement connections to prevent from arcing to surrounding structures without attaching the sleeve 2030 to the chuck top 1902. The electrical connection is preferably made by an at least partially threaded stud 2070 that extends thru a hollow standoff and has a nut that tightens onto the standoff to hold a continuous clamping force and therefore electrical contact to the chuck. The screw, partially threaded stud, hollow standoff, nut and washer materials are preferably matched and preferably comprise brass, to better match the CTE of the aluminum chuck top 1902, and the additional conductor area added by the sleeve 2030 reduces the resistance of the connection by two to four times over the material change alone for a given screw size. Additional nuts can be used to hold the wire lugs 2050 for attachment to measurement cables.

A third embodiment of this second group preferably includes an insulating sleeve 2030 or other electrically non-conductive cover attached over the measurement connections to prevent them from arcing to surrounding structures without attaching the sleeve 2030 to the chuck top 1902. The electrical connection is preferably made by an at least partially threaded stud 2070 that has a nut that tightens onto the chuck 1902 to hold a continuous clamping force and therefore electrical contact to the chuck 1902. An additional pair of nuts may be used to hold the wire lugs 2050 for attachment to measurement cables. The screw, partially threaded stud, nuts and washer materials are preferably matched and preferably made of brass, to better match the CTE of the aluminum chuck top 1902.

A fourth embodiment of this second group preferably includes an insulating sleeve 2030 or other electrically non-conductive cover attached over the measurement connections to prevent them from arcing to surrounding structures without attaching the sleeve 2030 to the chuck top 1902. The electrical connection is preferably made by a threaded standoff that screws into the chuck top 1902 or onto a stud in the chuck top 1902 and additionally a screw is used to hold the wire lugs 2050 for attachment to measurement cables to hold continuous clamping force and therefore electrical contact to the chuck 1902. The screw, standoff, and washer materials are preferably matched and preferably made of brass, to better match the CTE of the aluminum chuck top 1902, and the additional conductor area added by the threaded standoff reduces the resistance of the connection by two to four times over the material change alone for a given screw size.

A fifth embodiment of this second group preferably includes an insulating sleeve 2030 or other electrically non-conductive cover attached over the measurement connections to prevent arcing to surrounding structures without attaching the sleeve 2030 to the chuck top 1902. The electrical connection is made from a block of conductive material attached to the chuck top 1902 and enclosed within the insulating sleeve on at least 3 sides. A screw is used to hold the wire lugs 2050 for attachment to measurement cables to hold continuous clamping force and therefore electrical contact to the chuck 1902. The screw, conductive block, and washer materials are preferably matched and preferably made of brass, to better match the CTE of the aluminum chuck top 1902, and the additional conductor area added by the connection block reduces the resistance of the connection by at least two to four times over the material change alone for a given screw size.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A chuck comprising:
   (a) an upper conductive layer having a lower surface and an upper surface suitable to contact and support a device under test;
   (b) an upper insulating layer having an upper surface at least in partial face-to-face contact with said lower surface of said upper conductive layer, and a lower surface, wherein the upper insulating layer is horizontally distinct from the upper conductive layer; and
   (c) a middle conductive layer having an upper surface at least in partial face-to-face contact with said lower surface of said upper insulating layer, and a lower surface, wherein the middle conductive layer is horizontally distinct from the upper insulating layer;
   wherein the chuck is an assembly of separate parts, wherein the separate parts include the upper conductive layer, the upper insulating layer, and the middle conductive layer;
   wherein the upper conductive layer includes a conductive layer vacuum path configured to apply a vacuum to the lower surface of the upper conductive layer to retain the lower surface of the upper conductive layer in at least partial face-to-face contact with the upper surface of the upper insulating layer;
   wherein the upper insulating layer includes an insulating layer vacuum path configured to apply a vacuum to the lower surface of the upper insulating layer to retain the lower surface of the upper insulating layer in at least partial face-to-face contact with the upper surface of the middle conductive layer; and
   further wherein no vacuum path extends between the upper surface of the upper insulating layer and the lower surface of the upper insulating layer.

2. The chuck of claim 1 wherein said upper insulating layer extends beyond an exterior surface of said upper conductive layer and an exterior surface of said middle conductive layer.

3. The chuck of claim 1 wherein said upper insulating layer extends beyond an exterior surface of said upper conductive layer and an exterior surface of said middle conductive layer, and wherein said upper conductive layer has a smaller diameter than said middle conductive layer.

4. The chuck of claim 1 wherein said upper insulating layer includes at least one recess defined therein, wherein said recess is proximate an exterior surface of at least one of said upper conductive layer and an exterior surface of said middle conductive layer, wherein said recess extends around a majority of a circumference of said upper insulating layer, and further wherein said recess is configured to absorb stresses in said upper insulating layer.

5. The chuck of claim 1 further comprising an insulated lift pin slidably extendable from a retracted position within a lift pin hole formed within said upper surface of said upper conductive layer, and an insulated lift pin sleeve further interposed between said lift pin and said upper conductive layer, wherein said lift pin sleeve includes a flange projecting radially outward from an axis of said lift pin, said flange adapted in size and shape to increase at least one of an arc distance and a creepage distance characteristic of said chuck.

6. The chuck of claim 1 wherein said middle conductive layer comprises a guard potential held to a predetermined value, said predetermined value between a signal potential and a shield potential.

7. The chuck of claim 1, wherein said upper surface of said upper conductive layer includes thereon a vacuum distribution for holding said device under test.

8. The chuck of claim 7, wherein said vacuum distribution comprises a plurality of vacuum holes positioned across said upper surface of said upper conductive layer and close enough to one another to have overlapping areas of full vacuum effect so as to provide uninterrupted vacuum across zones of said upper surface of said upper conductive layer.

9. The chuck of claim 7 wherein said vacuum distribution comprises a porous sintered metal layer having at least as small as one micron sized pores through which a vacuum is drawn.

10. The chuck of claim 7 wherein said vacuum distribution comprises micro-grooves at least as small as 50 microns wide and 15 microns deep, said micro-grooves formed upon said upper surface of said upper conductive layer with close enough spacing so as to provide a substantially continuous vacuum field across zones of said upper surface of said upper conductive layer.

11. The chuck of claim 1, wherein the upper insulating layer extends entirely below the upper conductive layer.

12. The chuck of claim 1, wherein the middle conductive layer extends entirely below the upper insulating layer.

* * * * *